United States Patent
Lin et al.

(10) Patent No.: US 9,508,843 B2
(45) Date of Patent: Nov. 29, 2016

(54) HETEROJUNCTION SEMICONDUCTOR DEVICE FOR REDUCING PARASITIC CAPACITANCE

(71) Applicant: DELTA ELECTRONICS, INC., Kuei San (TW)

(72) Inventors: Li-Fan Lin, Kuei San (TW); Chun-Chieh Yang, Kuei San (TW); Wen-Chia Liao, Kuei San (TW); Ching-Chuan Shiue, Kuei San (TW); Shih-Peng Chen, Kuei San (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/496,471

(22) Filed: Sep. 25, 2014

(65) Prior Publication Data

US 2015/0243657 A1   Aug. 27, 2015

Related U.S. Application Data

(63) Continuation-in-part of application No. 14/185,322, filed on Feb. 20, 2014, now Pat. No. 8,957,493.

(30) Foreign Application Priority Data

Sep. 10, 2013  (TW) ............................... 102132512 A
Feb. 27, 2014  (TW) ............................... 103106659 A
Apr. 21, 2014  (TW) ............................... 103114340 A

(51) Int. Cl.
| | | |
|---|---|---|
| *H01L 29/788* | (2006.01) | |
| *H01L 29/778* | (2006.01) | |
| *H01L 23/00* | (2006.01) | |
| *H01L 23/495* | (2006.01) | |
| *H01L 29/40* | (2006.01) | |
| *H01L 29/417* | (2006.01) | |
| *H01L 29/423* | (2006.01) | |
| *H01L 29/20* | (2006.01) | |

(52) U.S. Cl.
CPC ..... *H01L 29/7786* (2013.01); *H01L 23/49537* (2013.01); *H01L 23/49541* (2013.01); *H01L 23/49562* (2013.01); *H01L 23/49575* (2013.01); *H01L 24/06* (2013.01);
(Continued)

(58) Field of Classification Search
USPC .................................................. 257/194, 316
See application file for complete search history.

(56) References Cited

U.S. PATENT DOCUMENTS 7,800,131 B2   9/2010   Miyamoto et al.
7,928,475 B2   4/2011   Parikh et al.
(Continued)

FOREIGN PATENT DOCUMENTS

CN   102544002   7/2012
CN   103178106   6/2013
(Continued)

*Primary Examiner* — Matthew Gordon
(74) *Attorney, Agent, or Firm* — Hauptman Ham, LLP

(57) ABSTRACT

A semiconductor device includes an active layer, a source electrode, a drain electrode, a gate electrode, an interlayer dielectric, an inter-source layer, an inter-source plug, an inter-drain layer, an inter-drain plug, an inter-gate layer, and an inter-gate plug. The active layer is made of III-V group semiconductors. The source electrode, the drain electrode, and the gate electrode are disposed on the active layer. The gate electrode is disposed between the source electrode and the drain electrode. The interlayer dielectric covers the source electrode, the drain electrode, and the gate electrode. The inter-source layer, the inter-drain layer, and the inter-gate layer are disposed on the interlayer dielectric. The inter-source plug is electrically connected to the source electrode and the inter-source layer. The inter-drain plug is electrically connected to the drain electrode and the inter-drain layer. The inter-gate plug is electrically connected to the gate electrode and the inter-gate layer.

16 Claims, 17 Drawing Sheets

(52) U.S. Cl.
CPC ........ *H01L 29/2003* (2013.01); *H01L 29/402* (2013.01); *H01L 29/41758* (2013.01); *H01L 29/4236* (2013.01); *H01L 29/42376* (2013.01); *H01L 2224/04042* (2013.01); *H01L 2224/05093* (2013.01); *H01L 2224/0603* (2013.01); *H01L 2224/48137* (2013.01); *H01L 2224/48247* (2013.01); *H01L 2224/48257* (2013.01); *H01L 2224/49111* (2013.01)

(56) References Cited

U.S. PATENT DOCUMENTS

| | | |
|---|---|---|
| 8,530,978 B1 | 9/2013 | Chu et al. |
| 2003/0082860 A1* | 5/2003 | Yoshida ............ H01L 21/28575 438/184 |
| 2005/0189562 A1* | 9/2005 | Kinzer ................ H01L 27/0605 257/192 |
| 2008/0272443 A1 | 11/2008 | Hoshi et al. |
| 2008/0303097 A1 | 12/2008 | Alter et al. |
| 2011/0248283 A1* | 10/2011 | Cao ................... H01L 29/42312 257/76 |
| 2013/0146946 A1* | 6/2013 | Tsurumi ............. H01L 29/4175 257/192 |

FOREIGN PATENT DOCUMENTS

| | | |
|---|---|---|
| TW | 200633211 | 9/2006 |
| TW | 201036156 | 10/2010 |
| TW | 201338113 | 9/2013 |
| TW | 201340316 | 10/2013 |

\* cited by examiner

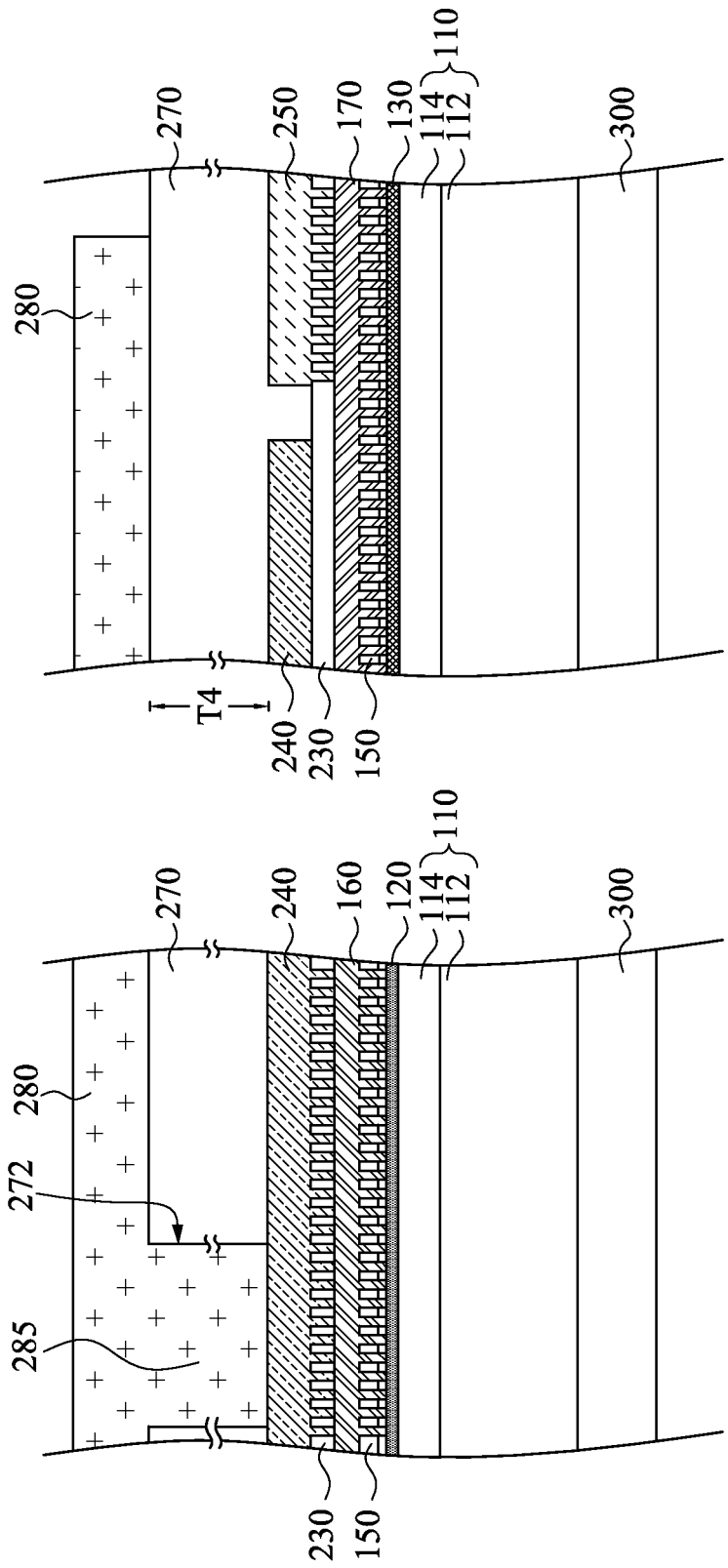

HETEROJUNCTION SEMICONDUCTOR DEVICE FOR REDUCING PARASITIC CAPACITANCE

RELATED APPLICATIONS

The present application is a continuation-in-part application of U.S. application Ser. No. 14/185,322, filed Feb. 20, 2014, and claims priority to Taiwan Application Serial Number 102132512, filed Sep. 10, 2013; Taiwan Application Serial Number 103106659, filed Feb. 27, 2014; and Taiwan Application Serial Number 103114340, filed Apr. 21, 2014, which are herein incorporated by reference.

BACKGROUND

Field of Invention

The present invention relates to a semiconductor device.

Description of Related Art

A field effect transistor, which controls a current flowing through it with an electric field generated in a material layer, is a switch device widely utilized in circuits made up of semiconductor devices. In greater detail, a field effect transistor includes a gate electrode, a source electrode, a drain electrode, and an active layer. The source electrode and the drain electrode are located at opposite sides of the active layer. By controlling the voltage applied to the gate electrode, the electric field in the active layer is affected to allow current to flow from the source electrode to the drain electrode. As a result, the field effect transistor is in an on state.

Generally, parasitic capacitances may be generated inside the field effect transistor depending on the structural design of the field effect transistor. These parasitic capacitances deteriorate the operational properties of the field effect transistor. Moreover, in a package structure of the field effect transistor, an undesirable package structure may increase the parasitic capacitance of the field effect transistor. Hence, the interior design and the package design of the field effect transistor are areas undergoing development in the art.

SUMMARY

An aspect of the present invention is to provide a semiconductor device including an active layer, at least one source electrode, at least one drain electrode, at least one gate electrode, an interlayer dielectric, at least one inter-source layer, at least one inter-source plug, at least one inter-drain layer, at least one inter-drain plug, at least one inter-gate layer, and at least one inter-gate plug. The active layer is made of III-V group semiconductors. The source electrode and the drain electrode are disposed on the active layer. The gate electrode is disposed on or above the active layer and between the source electrode and the drain electrode. The interlayer dielectric covers the source electrode, the drain electrode, and the gate electrode. The interlayer dielectric has at least one first inter-source via hole, at least one first inter-drain via hole, and at least one inter-gate via hole. The inter-source layer is disposed on the interlayer dielectric. The inter-source plug is filled in the first inter-source via hole and is electrically connected to the source electrode and the inter-source layer. The inter-drain layer is disposed on the interlayer dielectric. The inter-drain plug is filled in the first inter-drain via hole and is electrically connected to the drain electrode and the inter-drain layer. The inter-gate layer is disposed on the interlayer dielectric. The inter-gate plug is filled in the inter-gate via hole and is electrically connected to the gate electrode and the inter-gate layer.

In one or more embodiments, the semiconductor device further includes at least one gate field plate integrally formed with the gate electrode.

In one or more embodiments, the semiconductor device further includes at least one gate field plate disposed between the active layer and the interlayer dielectric, and disposed between the gate electrode and the drain electrode. Both of the inter-gate plugs and the inter-gate via holes are plural, and at least a portion of the inter-gate plugs are electrically connected to the gate field plate and the inter-gate layer.

In one or more embodiments, orthogonal projections of the inter-source layer and the gate electrode on the active layer are separated from each other.

In one or more embodiments, the semiconductor device further includes a passivation layer covering the active layer. The passivation layer has at least one source opening and at least one drain opening therein. The source electrode and the drain electrode are respectively disposed in the source opening and the drain opening to electrically contact the active layer.

In one or more embodiments, the semiconductor device further includes a gate dielectric layer disposed at least between the gate electrode and the active layer.

In one or more embodiments, the passivation layer has a gate opening therein, and the gate electrode conformally covers the gate opening.

In one or more embodiments, the active layer has a recess, and the passivation layer has a gate opening therein. The gate opening exposes the recess. The gate electrode conformally covers the gate opening and the recess.

In one or more embodiments, the semiconductor device further includes a first insulating layer, a first source pad, a first drain pad, at least one source plug, and at least one drain plug. The first insulating layer covers the inter-source layer, the inter-gate layer, and the inter-drain layer. The first insulating layer has at least one source via hole and at least one drain via hole therein. The first source pad and the first drain pad are disposed on the first insulating layer. The source plug is filled in the source via hole and is electrically connected to the first source pad and the inter-source layer. The drain plug is filled in the drain via hole and is electrically connected to the first drain pad and the inter-drain layer.

In one or more embodiments, orthogonal projections of the first source pad and the first drain pad on the active layer are separated from each other.

In one or more embodiments, an orthogonal projection of the inter-source layer on the active layer forms a source region. An orthogonal projection of the first drain pad on the active layer forms a drain pad region. The drain pad region overlaps at least a portion of the source region, and an area of an overlapping region between the drain pad region and the source region is smaller than or equal to 40% of an area of the source region.

In one or more embodiments, an orthogonal projection of the inter-drain layer on the active layer forms a drain region. An orthogonal projection of the first source pad on the active layer forms a source pad region. The source pad region overlaps at least a portion of the drain region, and an area of an overlapping region between the source pad region and the drain region is smaller than or equal to 40% of an area of the drain region.

In one or more embodiments, a resistance value of the first source pad per unit length is smaller than a resistance value of the source electrode per unit length.

In one or more embodiments, a resistance value of the first drain pad per unit length is smaller than a resistance value of the drain electrode per unit length.

In one or more embodiments, an orthogonal projection of the source electrode on the active layer, an orthogonal projection of the drain electrode on the active layer, and an orthogonal projection of the gate electrode on the active layer together define an active area. An orthogonal projection of the first source pad on the active layer forms a source pad region, and at least a portion of the source pad region is within the active area.

In one or more embodiments, an orthogonal projection of the first drain pad on the active layer forms a drain pad region, and at least a portion of the drain pad region is within the active area.

In one or more embodiments, the first source pad includes a source pad body and at least one source pad branch. An orthogonal projection of the source pad body on the active layer overlaps at least a portion of the drain region. The first drain pad includes a drain pad body and at least one drain pad branch. The drain pad body is separated from the source pad body. An orthogonal projection of the drain pad body on the active layer overlaps at least a portion of the source region, and the source pad branch extends from the source pad body toward the drain pad body. The drain pad branch extends from the drain pad body toward the source pad body.

In one or more embodiments, the semiconductor device further includes a second insulating layer, a second source pad, a second drain pad, a source pad connection portion, and a drain pad connection portion. The second insulating layer is disposed on the first source pad, the first drain pad, and the first insulating layer. The second insulating layer has a source pad opening and a drain pad opening to respectively expose a portion of the first source pad and a portion of the first drain pad, and the second insulating layer has a thickness greater than 7 μm. The second source pad is disposed on the second insulating layer. The second drain pad is separated from the second source pad and is disposed on the second insulating layer. The source pad connection portion is disposed in the source pad opening and is electrically connected to the first source pad and the second source pad. The drain pad connection portion is disposed in the drain pad opening and is electrically connected to the first drain pad and the second drain pad.

Another aspect of the present invention is to provide a semiconductor device package including a substrate, the semiconductor device, and a lead frame. The semiconductor device is disposed on the substrate. The lead frame is disposed on a side of the substrate opposite to the semiconductor device and is electrically connected to the gate electrode.

In one or more embodiments, the semiconductor device package further includes a gate pin, a source pin, and a drain pin. The gate pin is electrically connected to the lead frame and the gate electrode. The source pin and the drain pin are respectively electrically connected to the source electrode and the drain electrode, and are both electrically isolated from the lead frame.

In one or more embodiments, the semiconductor device package further includes an inter-insulating layer disposed between the lead frame and the substrate. A parasitic capacitance between the substrate and the lead frame is smaller than a parasitic capacitance between the substrate and the semiconductor device.

Yet another aspect of the present invention is to provide a semiconductor device package including a substrate, the semiconductor device, and a lead frame. The semiconductor device is disposed on the substrate. The lead frame is disposed on a side of the substrate opposite to the semiconductor device and is electrically isolated from the gate electrode, the source electrode, and the drain electrode.

Yet another aspect of the present invention is to provide a semiconductor device package including a substrate, the semiconductor device, a lead frame, and an inter-insulating layer. The semiconductor device is disposed on the substrate. The lead frame is disposed on a side of the substrate opposite to the semiconductor device and electrically connected to the source electrode or the drain electrode. The inter-insulating layer is disposed between the lead frame and the substrate. A parasitic capacitance between the substrate and the lead frame is smaller than a parasitic capacitance between the substrate and the semiconductor device.

In one or more embodiments, the semiconductor device package further includes a gate pin, a source pin, and a drain pin. The gate pin is electrically connected to the gate electrode. The source pin and the drain pin are respectively electrically connected to the source electrode and the drain electrode, and one of the source pin and the drain pin is electrically connected to the lead frame.

Yet another aspect of the present invention is to provide a semiconductor device package including a substrate, the semiconductor device, and a lead frame. The semiconductor device is disposed on the substrate. The semiconductor device is electrically connected to the lead frame using a flip-chip configuration. The lead frame includes a first portion, a second portion, and a third portion. The first portion is electrically connected to the gate electrode. The second portion is electrically connected to the source electrode. The third portion is electrically connected to the drain electrode.

In one or more embodiments, the semiconductor device is a depletion mode transistor. The semiconductor device package further includes an enhancement mode transistor. The source electrode of the depletion mode transistor is electrically connected to a drain of the enhancement mode transistor.

In one or more embodiments, the gate electrode of the depletion mode transistor is electrically connected to a source electrode of the enhancement mode transistor.

BRIEF DESCRIPTION OF THE DRAWINGS

FIG. 9A is a cross-sectional view taken along line 9A-9A of FIG. 8;

FIG. 9B is a cross-sectional view taken along line 9B-9B of FIG. 8;

DETAILED DESCRIPTION

Figure 1:
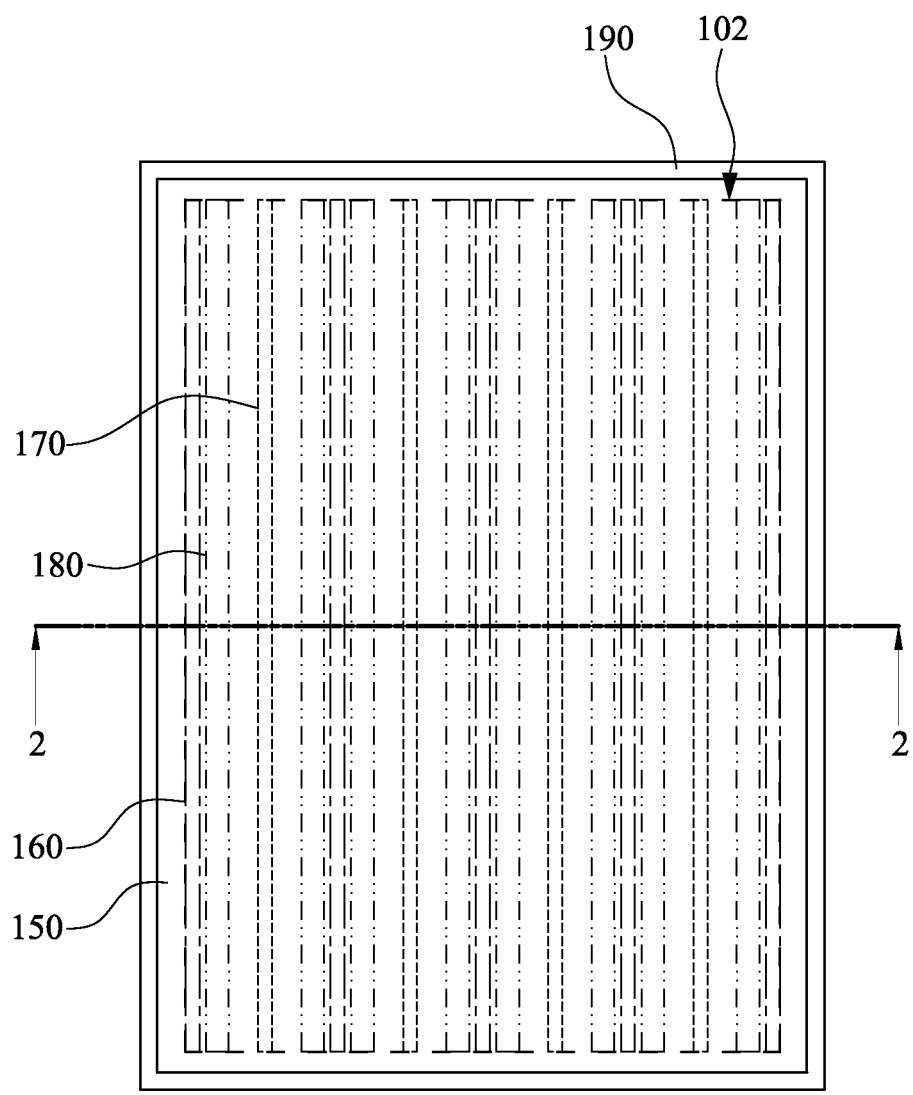
FIG. 1 is a top view of a semiconductor device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
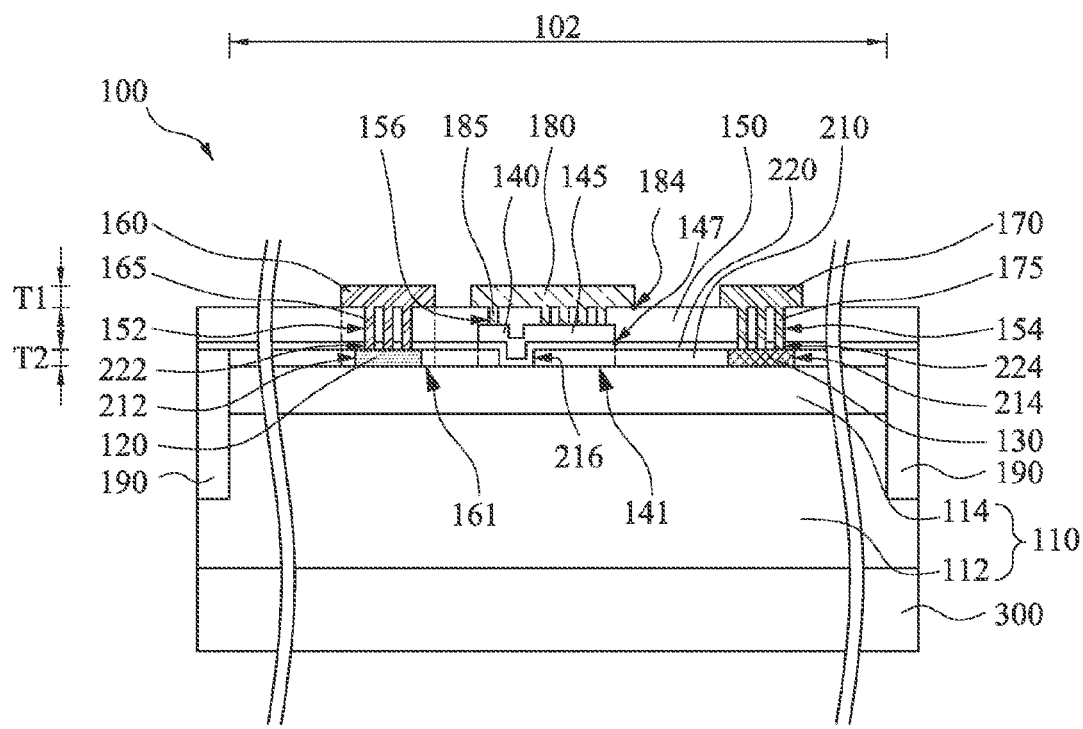
FIG. 2 is a cross-sectional view taken along line 2-2 of FIG. 1.

FIG. 1 is a top view of a semiconductor device 100 according to one embodiment of the present invention, and FIG. 2 is a cross-sectional view taken along line 2-2 of FIG. 1. The semiconductor device 100 includes an active layer 110, at least one source electrode 120, at least one drain electrode 130, at least one gate electrode 140, an interlayer dielectric 150, at least one inter-source layer 160, at least one inter-source plug 165, at least one inter-drain layer 170, at least one inter-drain plug 175, at least one inter-gate layer 180, and at least one inter-gate plug 185. The active layer 110 is made of III-V group semiconductors. In one embodiment of the present invention, the active layer 110 includes a plurality of III-nitride semiconductors with different energy gaps, for example, a gallium nitride layer and an aluminum gallium nitride layer, and has a two-dimensional electron gas (2DEG) channel. The source electrode 120 and the drain electrode 130 are disposed on the active layer 110, and are electrically isolated from each other. The gate electrode 140 is disposed on or above the active layer 110 and between the source electrode 120 and the drain electrode 130. The interlayer dielectric 150 covers the source electrode 120, the drain electrode 130, and the gate electrode 140. The interlayer dielectric 150 has at least one first inter-source via hole 152, at least one first inter-drain via hole 154, and at least one inter-gate via hole 156. The inter-source layer 160 is disposed on the interlayer dielectric 150. The inter-source plug 165 is filled in the first inter-source via hole 152 and is electrically connected to the source electrode 120 and the inter-source layer 160. The inter-drain layer 170 is disposed on the interlayer dielectric 150. The inter-drain plug 175 is filled in the first inter-drain via hole 154 and is electrically connected to the drain electrode 130 and the inter-drain layer 170. The inter-gate layer 180 is disposed on the interlayer dielectric 150. The inter-gate plug 185 is filled in the inter-gate via hole 156 and is electrically connected to the gate electrode 140 and the inter-gate layer 180.

It is noted that for clarity, all of the inter-source layers 160, the inter-drain layers 170, and the inter-gate layers 180 of FIG. 1 are shown with different dashed lines. In reality, the inter-source layers 160, the inter-drain layers 170, and the inter-gate layers 180 are all disposed on the interlayer dielectric 150. Moreover, the source electrode 120, the drain electrode 130, the gate electrode 140, the first inter-source via holes 152, the first inter-drain via holes 154, and the inter-gate via holes 156 are only depicted in the cross-sectional view and not in the top view.

The semiconductor device 100 of the present embodiment can reduce parasitic capacitance of the semiconductor device 100, and the inter-gate layer 180 can disperse the electrical field of the semiconductor device 100 to increase the breakdown voltage. More specifically, to disperse the electrical field, a source field plate, which is similar to the inter-source layer 160 of the present embodiment, of a general transistor crosses over a gate electrode and extends toward a drain electrode. However, a gate-source parasitic capacitance (Cgs) may be generated between the source field plate and the gate electrode to reduce the quality of the transistor. In this embodiment, the semiconductor device 100 includes the inter-gate layer 180 that can replace the source field plate to disperse the electrical field. For example, the electrical field is dispersed between an end 184 of the inter-gate layer 180 and the active layer 110 to increase the breakdown voltage. In addition, since the inter-gate layer 180 is electrically connected to the gate electrode 140, there is no parasitic capacitance generated between the inter-gate layer 180 and the gate electrode 140.

In this embodiment, the orthogonal projection 161 of the inter-source layer 160 and the orthogonal projection 141 of the gate electrode 140 on the active layer 110 are separated from each other. Therefore, there is no parasitic capacitance Cgs generated between the inter-source layer 160 and the gate electrode 140. However, the claimed scope of the present invention is not limited in this respect.

In this embodiment, the semiconductor device 100 can further include at least one gate field plate 145 that is integrally formed with the gate electrode 140. The gate field plate 145 is disposed between the active layer 110 and the interlayer dielectric 150, and the gate field plate 145 can extend towards the drain electrode 130 from the gate electrode 140. This configuration can further disperse the electrical field between the gate electrode 140 and the active layer 110. For example, the electrical field can be generated between one end 147 of the gate field plate 145 and the active layer 110 to further increase the breakdown voltage.

In this embodiment, the source electrode 120 can directly touch the active layer 110. Since the source electrode 120 is generally an ohmic electrode which has a resistance per unit length that is high, the inter-source layer 160 disposed above the source electrode 120 can reduce the resistance of the source electrode 120. More specifically, the resistance value of the inter-source layer 160 per unit length can be smaller than the resistance value of the source electrode 120 per unit length. In the embodiment of FIG. 2, the thickness T1 of the inter-source layer 160 is greater than the thickness T2 of the source electrode 120, such that the resistance of the source electrode 120 can be improved through the electrical connection between the inter-source layer 160 and the source electrode 120.

Similarly, the drain electrode 130 can directly touch the active layer 110. Since the drain electrode 130 is generally an ohmic electrode which has a resistance per unit length that is high, the inter-drain layer 170 disposed above the drain electrode 130 can reduce the resistance of the drain electrode 130. More specifically, the resistance value of the inter-drain layer 170 per unit length can be smaller than the resistance value of the drain electrode 130 per unit length. In the embodiment of FIG. 2, the thickness T1 of the inter-drain layer 170 is greater than the thickness T2 of the drain electrode 130, such that the resistance of the drain electrode 130 can be improved through the electrical connection between the inter-drain layer 170 and the drain electrode 130.

In this embodiment, the semiconductor device 100 can further include a passivation layer 210 covering the active layer 110. The passivation layer 210 has at least one source opening 212 and at least one drain opening 214 therein. The source electrode 120 and the drain electrode 130 are respectively disposed in the source opening 212 and the drain opening 214 to electrically contact the active layer 110.

In one or more embodiments, the semiconductor device 100 can further include a gate dielectric layer 220 disposed at least between the gate electrode 140 and the active layer 110. The gate dielectric layer 220 may selectively cover the passivation layer 210, and the gate dielectric layer 220 has at least one second inter-source via hole 222 and at least one second inter-drain via hole 224. A portion of the inter-source plug 165 is filled in the second inter-source via hole 222 to electrically interconnect the inter-source pad 160 and the source electrode 120. A portion of the inter-drain plug 175 is filled in the second inter-drain via hole 224 to electrically interconnect the inter-drain pad 170 and the drain electrode 130.

In one or more embodiments, the passivation layer 210 has a gate opening 216 therein, and the gate dielectric layer 220 and the gate electrode 140 conformally cover the gate opening 216. The gate opening 216 can adjust the electrical properties of the gate electrode 140. For example, in this embodiment, the semiconductor device 100 can be a depletion mode transistor. However, in other embodiments, the passivation layer 210 may not have the gate opening 216, and the claimed scoped of the present invention is not limited in this respect.

In one or more embodiments, the active layer 110 includes a plurality of different nitride-based semiconductor layers to allow two-dimensional electron gas (2DEG) to be generated at the heterojunction so as to create a conducting path. For example, a stack structure made up of a gallium nitride (GaN) layer 112 and an aluminum gallium nitride (AlGaN) layer 114 may be utilized, and the aluminum gallium nitride layer 114 is disposed on the gallium nitride layer 112. With this structure, two-dimensional electron gas can exist at the interface of the gallium nitride layer 112 and the aluminum gallium nitride layer 114. Thus, when the semiconductor device 100 is in an on state, the on current between the source electrode 120 and the drain electrode 130 is able to flow along the interface of the gallium nitride layer 112 and the aluminum gallium nitride layer 114. The active layer 110 may be selectively disposed on a substrate 300. The substrate 300 may be a silicon substrate or a sapphire substrate, but the claimed scope of the present invention is not limited in this respect. In one embodiment, the semiconductor device 100 may further include a buffer layer (not shown) disposed between the active layer 110 and the substrate 300.

Reference is made to FIGS. 1 and 2. In the present embodiment, the source electrode 120, the drain electrode 130, and the gate electrode 140 together define an active area 102. The semiconductor device 100 further includes an insulation area 190 surrounding the active area 102, and at least a portion of the insulation area 190 is located in the active layer 110 to prevent leakage currents from being generated and thereby increases the breakdown voltage. Furthermore, the numbers of the source electrodes 120, the drain electrodes 130, and the gate electrode 140 are plural. The source electrodes 120 are alternately arranged with the drain electrodes 130, and each of the gate electrodes 140 is disposed between a pair of one of the adjacent source electrodes 120 and one of the drain electrodes 130 to increase the amount of the on current flowing through the semiconductor device 100. Moreover, the via holes mentioned above, such as the first inter-source via hole 152, the first inter-drain via hole 154, the inter-gate via hole 156, the second inter-source via hole 222, and the second inter-drain via hole 224, can be formed in the shape of a circle, a rectangle, a polygon, an arc, or their combinations according to actual requirements.

Figure 3:
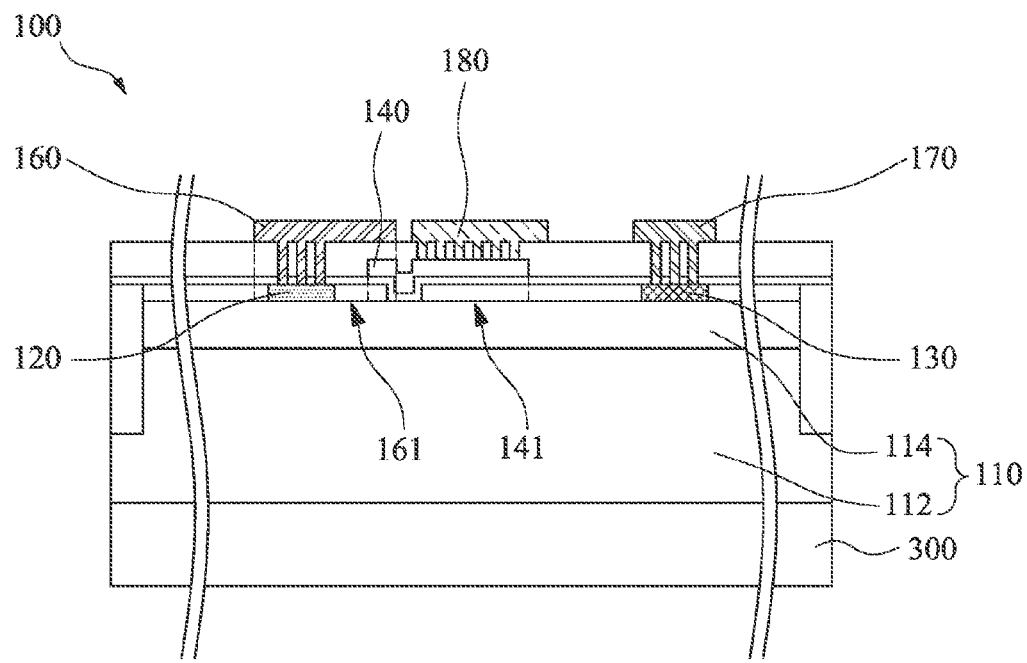
FIG. 3 is a cross-sectional view of the semiconductor device of FIG. 1 according to another embodiment.

Reference is made to FIG. 3 which is a cross-sectional view of the semiconductor device 100 of FIG. 1 according to another embodiment. The cross-sectional position of FIG. 3 is the same as that of FIG. 2. The difference between the present embodiment and the embodiment of FIG. 2 pertains to the relative position between the inter-source layer 160 and the gate electrode 140. In this embodiment, an orthogonal projection 161 of the inter-source layer 160 on the active layer 110 overlaps an orthogonal projection 141 of the gate electrode 140 on the active layer 110. In greater detail, a portion of the inter-source layer 160 can extend to above of the gate electrode 140 to reduce the resistance of the source electrode 120. Since the orthogonal projection 161 of the inter-source layer 160 only overlaps a portion of the orthogonal projection 141 of the gate electrode 140, the parasitic capacitance Cgs thereof is smaller than the parasitic capacitance Cgs of a traditional transistor. Other relevant structural details of the present embodiment are all the same as the embodiment of FIG. 2, and, therefore, a description in this regard will not be repeated hereinafter.

Figure 4:
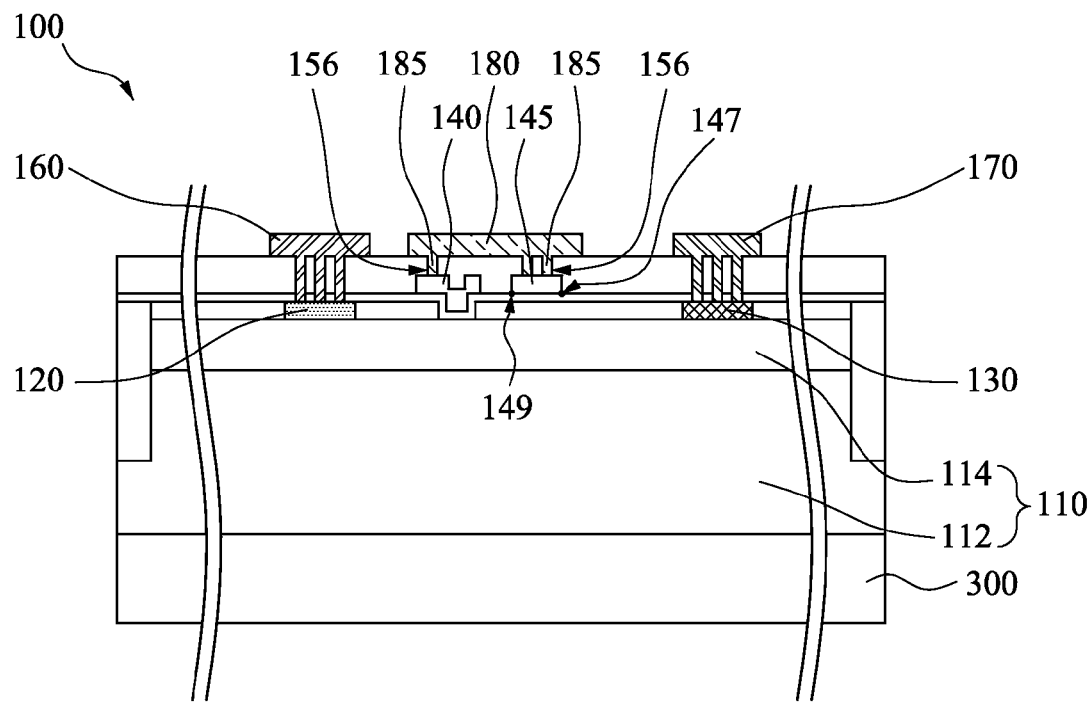
FIG. 4 is a cross-sectional view of the semiconductor device of FIG. 1 according to yet another embodiment.

Reference is made to FIG. 4 which is a cross-sectional view of the semiconductor device 100 of FIG. 1 according to yet another embodiment. The cross-sectional position of FIG. 4 is the same as that of FIG. 2. The difference between the present embodiment and the embodiment of FIG. 2 pertains to the structure of the gate field plate 145. In this embodiment, the gate field plate 145 is disposed between the gate electrode 140 and the drain electrode 130, and the gate field plate 145 is separated from the gate electrode 140. Both of the inter-gate plugs 185 and the inter-gate via holes 156 are plural, and at least a portion of the inter-gate plugs 185 are electrically connected to the gate field plate 145 and the inter-gate layer 180. In other words, the gate 140 can be electrically connected to the gate field plate 145 through the inter-gate plugs 185 and the inter-gate layer 180. In this embodiment, the electrode field may be generated between ends 147, 149 of the gate field plate 145 and the active layer 110 to enhance the breakdown voltage. Moreover, since the gate field plate 145 is separated from the gate electrode 140, the parasitic capacitance Cgd between the gate field plate 145 and the active layer 110 can be smaller than the parasitic capacitance Cgd of the semiconductor device 100 of FIG. 2. Other relevant structural details of the present embodiment are all the same as the embodiment of FIG. 2, and, therefore, a description in this regard will not be repeated hereinafter.

Figure 5:
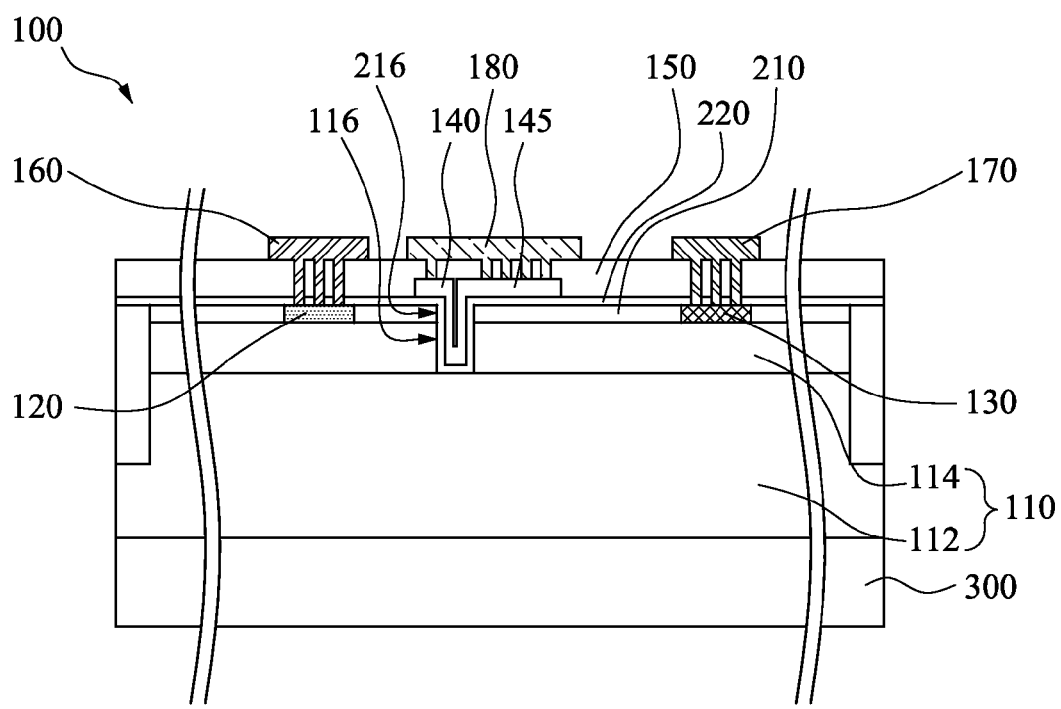
FIG. 5 is a cross-sectional view of the semiconductor device of FIG. 1 according to still yet another embodiment.

Reference is made to FIG. 5 which is a cross-sectional view of the semiconductor device 100 of FIG. 1 according to still yet another embodiment. The cross-sectional position of FIG. 5 is the same as that of FIG. 2. The difference between the present embodiment and the embodiment of FIG. 2 pertains to the configuration between the gate electrode 140 and the active layer 110. In this embodiment, the active layer 110 has a recess 116. More specifically, the recess 116 is located in the gallium aluminum nitride layer 114. The passivation layer 210 of the semiconductor device 100 has a gate opening 216 therein and the gate opening 216 exposes the recess 116. The gate dielectric layer 220 and the gate electrode 140 conformally cover the gate opening 216 and the recess 116. The gate electrode 140 can control the 2DEG of the active layer 110 through the recess 116. Therefore, in contrast to the depletion mode transistor of FIG. 2, the semiconductor device 100 of the present embodiment is an enhancement mode transistor. Other relevant structural details of the present embodiment are all the same as the embodiment of FIG. 2, and, therefore, a description in this regard will not be repeated hereinafter.

Figure 6:
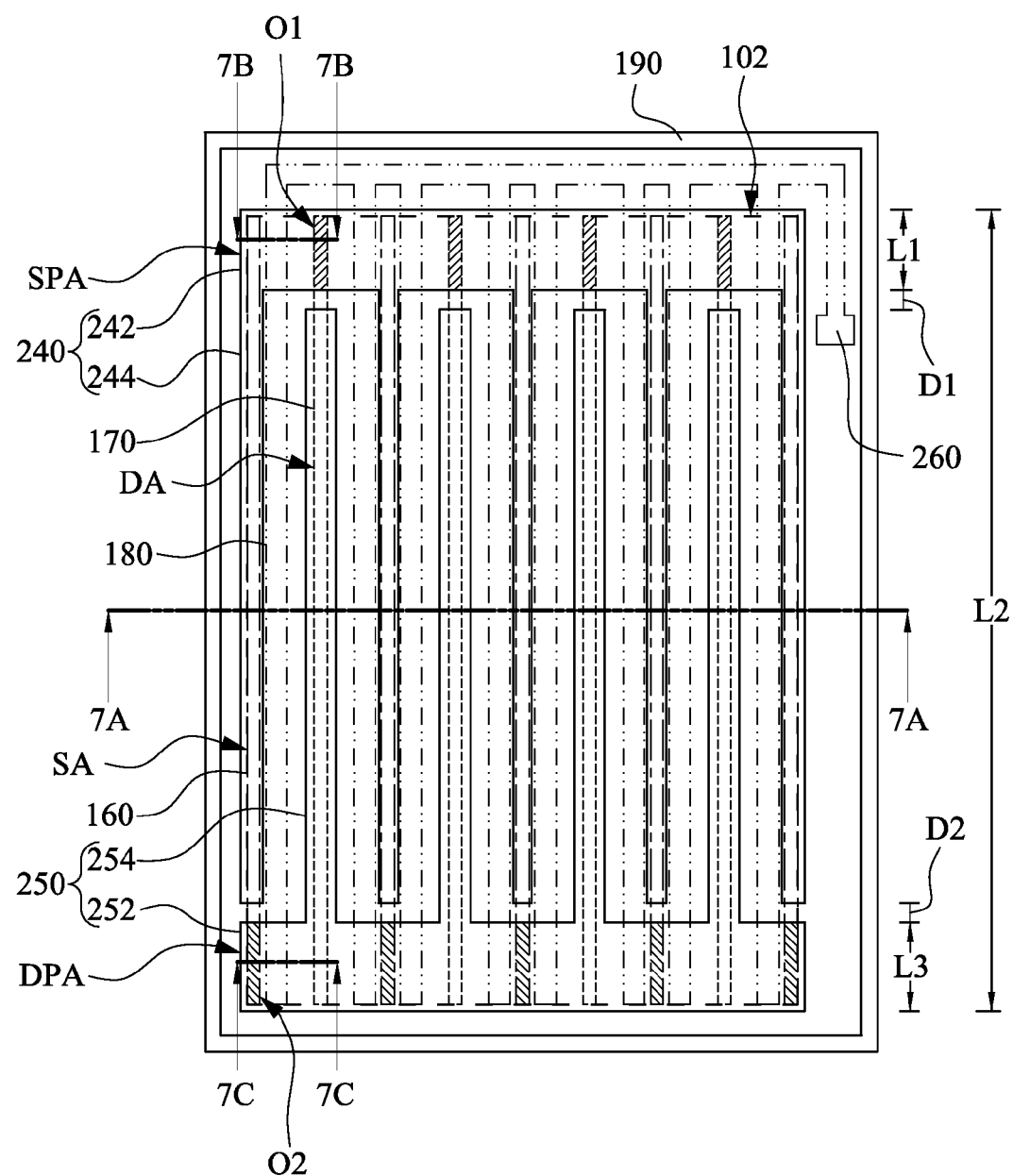
FIG. 6 is a top view of a semiconductor device according to another embodiment of the present invention.
Figure 7A:
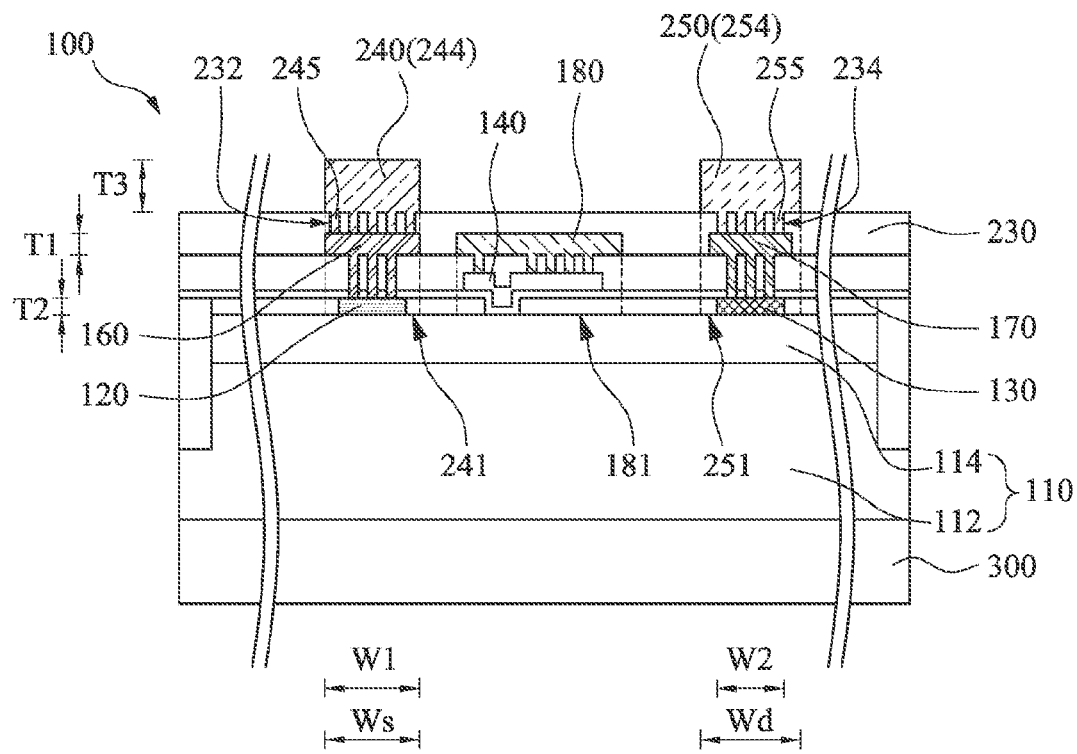
FIG. 7A is a cross-sectional view taken along line 7A-7A of FIG. 6.

FIG. 6 is a top view of a semiconductor device 100 according to another embodiment of the present invention, and FIG. 7A is a cross-sectional view taken along line 7A-7A of FIG. 6. The difference between the present embodiment and the embodiment of FIG. 2 pertains to a first insulating layer 230, a first source pad 240, a first drain pad 250, a source plug 245 and a drain plug 255. That is, in this embodiment, the semiconductor device 100 further includes the first insulating layer 230, the first source pad 240, the first drain pad 250, at least one source plug 245 and at least one drain plug 255. The first insulating layer 230 covers the inter-source layer 160, the inter-gate layer 180, and the inter-drain layer 170. The first insulating layer 230 has at least one source via hole 232 and at least one drain via hole 234 therein. The first source pad 240 and the first drain pad 250 are disposed on the first insulating layer 230. The source plug 245 is filled in the source via hole 232 and is electrically connected to the first source pad 240 and the inter-source layer 160. The drain plug 255 is filled in the drain via hole 234 and is electrically connected to the first drain pad 250 and the inter-drain layer 170. The semiconductor device 100 can further include a gate pad 260 electrically connected to the plurality of inter-gate layers 180. For the sake of clarity, it is noted that both the source plug 245 and the drain plug 255 are only depicted in the cross-sectional view and not in the top view.

In this embodiment, the orthogonal projection 241 of the first source pad 240, the orthogonal projection 251 of the first drain pad 250, and the orthogonal projection 181 of the inter-gate layer 180 on the active layer 110 are separated from each other. In other words, both of the first source pad 240 and the first drain pad 250 do not extend to above the inter-gate layer 180. This configuration can further decrease parasitic capacitances generated between the first source pad 240 and the inter-gate layer 180, and between the first drain pad 250 and the inter-gate layer 180.

Reference is made to FIG. 6. In this embodiment, an orthogonal projection of the inter-drain layer 170 on the active layer 110 forms a drain region DA, and an orthogonal projection of the first source layer 240 on the active layer 110 forms a source pad region SPA. The source pad region SPA overlaps at least a portion of the drain region DA, and an area of an overlapping region O1 between the source pad region SPA and the drain region DA is smaller than or equal to 40% of an area of the drain region DA. For example, in FIG. 6, the overlapping region O1 has a length L1 and the inter-drain layer 170 has a length L2, and the length L1 is less than or equal to 40% of the length L2.

Moreover, an orthogonal projection of the inter-source layer 160 on the active layer 110 forms a source region SA, and an orthogonal projection of the first drain pad 250 on the active layer 110 forms a drain pad region DPA. The drain pad region DPA overlaps at least a portion of the source region SA, and an area of an overlapping region O2 between the drain pad region DPA and the source region SA is smaller than or equal to 40% of an area of the source region SA. For example, in FIG. 6, the overlapping region O2 has a length L3 and the inter-source layer 160 has the length L2, and the length L3 is less than or equal to 40% of the length L2.

As mentioned previously, the overlapping region O1 is formed between the source pad region SPA and the drain region DA, and the overlapping region O2 is formed between the drain pad region DPA and the source region SA. In other words, at least a portion of the first source pad 240 is above the inter-drain layer 170 and at least a portion of the first drain pad 250 is above the inter-source layer 160. With this configuration, the size of the semiconductor device 100 can shrink to increase the area utilization ratio of the active layer 110. The term area utilization ratio refers to the ratio of the area of the active layer 110 through which on currents flowing between the source electrodes 120 and the drain electrodes 130 actually pass to the area of the active layer 110 that is available for currents to pass through in the semiconductor device 100 according to the present embodiment. Since the area of the overlapping region O1 is smaller than or equal to 40% of the area of the drain region DA and the area of an overlapping region O2 is smaller than or equal to 40% of the area of the source region SA, parasitic capacitances generated between the first source pad 240 and the inter-drain layer 170 and between the first drain pad 250 and the inter-source layer 160 are effectively reduced. In another embodiment of the present invention, the area of the overlapping region O1 is greater than 1% of the area of the drain region DA and smaller than 20% of the area of the drain region DA. The area of the overlapping region O2 is greater than 1% of the area of the source region SA and smaller than 20% of the area of the source region SA.

In the present embodiment, the first source pad 240 includes a source pad body 242 and at least one source pad branch 244. A direction of the source pad body 242 is approximately perpendicular to an elongation direction of the inter-source layer 160, and an elongation direction of the source pad branch 244 is approximately parallel to the elongation direction of the inter-source layer 160. An orthogonal projection 241 of the source pad body 242 on the active layer 110 (see FIG. 7A) overlaps at least a portion of the drain region DA, such as the overlapping region O1 in FIG. 6. The first drain pad 250 includes a drain pad body 252 and at least one drain pad branch 254. A direction of the drain pad body 252 is approximately perpendicular to an elongation direction of the inter-drain layer 170, and an elongation direction of the drain pad branch 254 is approximately parallel to the elongation direction of the inter-drain layer 170. The drain pad body 252 is separate from the source pad body 242. An orthogonal projection 251 of the drain pad body 252 on the active layer 110 overlaps at least a portion of the source region SA, such as the overlapping region O2 in FIG. 6. The source pad branch 244 extends from the source pad body 242 toward the drain pad body 252. The drain pad branch 254 extends from the drain pad body 252 toward the source pad body 242. In another embodiment of the present invention, in addition to being strip-shaped, the source pad branch 244 may be wave-shaped, zigzag-shaped, irregularly shaped, or some combination thereof, and the source pad branch 242 extends from the source pad body 242 toward the drain pad body 252. Similarly, a shape of the drain pad branch 254 may be different depending on product design, and the drain pad branch 254 extends from the drain pad body 252 toward the source pad body 242. In one embodiment of the present invention, the first source pad 240 or the first drain pad 250 may be electrically connected to external circuits through other conductive elements, such as a bonding wire, a ribbon, a clip, etc., to enable the operation of circuits.

Reference is made to FIGS. 6 and 7A. In greater detail, an orthogonal projection of the source pad branch 244 on the active layer 110 overlaps at least a portion of the inter-source layer 160. Hence, the source plugs 245 may be disposed between the source pad branch 244 and the inter-source layer 160 to provide an adequate electrical connection between the first source pad 240 and the inter-source layer 160. As a result, resistance values of the inter-source layer 160 and the source electrode 120 themselves are improved. In addition, when a resistance value of the first source pad 240 per unit length is smaller than a resistance value of the source electrode 120 per unit length (for example, in FIG. 7A, a thickness T3 of the first source pad 240 is greater than a thickness T2 of the source electrode 120), the resistance values of the inter-source layer 160 and the source electrode 120 themselves are also improved.

In addition, an orthogonal projection of the drain pad branch 254 on the active layer 110 overlaps at least a portion of the inter-drain layer 170. Hence, the drain plugs 255 may be disposed between the drain pad branch 254 and the inter-drain layer 170 to provide an adequate electrical connection between the first drain pad 250 and the inter-drain layer 170. As a result, resistance values of the inter-drain layer 170 and the drain electrode 130 themselves are improved. In addition, when a resistance value of the first drain pad 250 per unit length is smaller than a resistance value of the drain electrode 130 per unit length (for example, in FIG. 7A, a thickness T3 of the first drain pad 250 is greater than a thickness T2 of the drain electrode 130), the resistance values of the inter-drain layer 170 and the drain electrode 130 themselves are also improved.

Figure 7B:
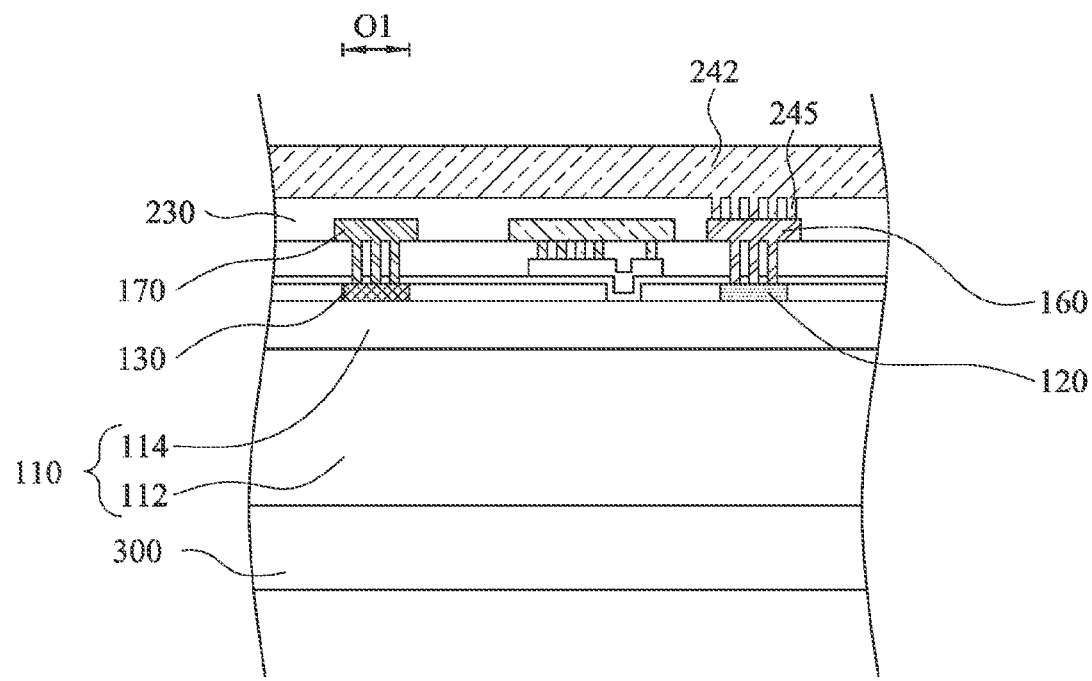
FIG. 7B is a cross-sectional view taken along line 7B-7B of FIG. 6.

FIG. 7B is a cross-sectional view taken along line 7B-7B of FIG. 6. The source plugs 245 may be disposed between the source pad body 242 and the inter-source layer 160 to provide an adequate electrical connection between the source pad body 242 and the inter-source layer 160. In addition, because the source pad body 242 is electrically isolated from the inter-drain layer 170, no plug exists between the source pad body 242 and the inter-drain layer 170 (that is, the portion of the first insulating layer 230 above the overlapping region O1).

Figure 7C:
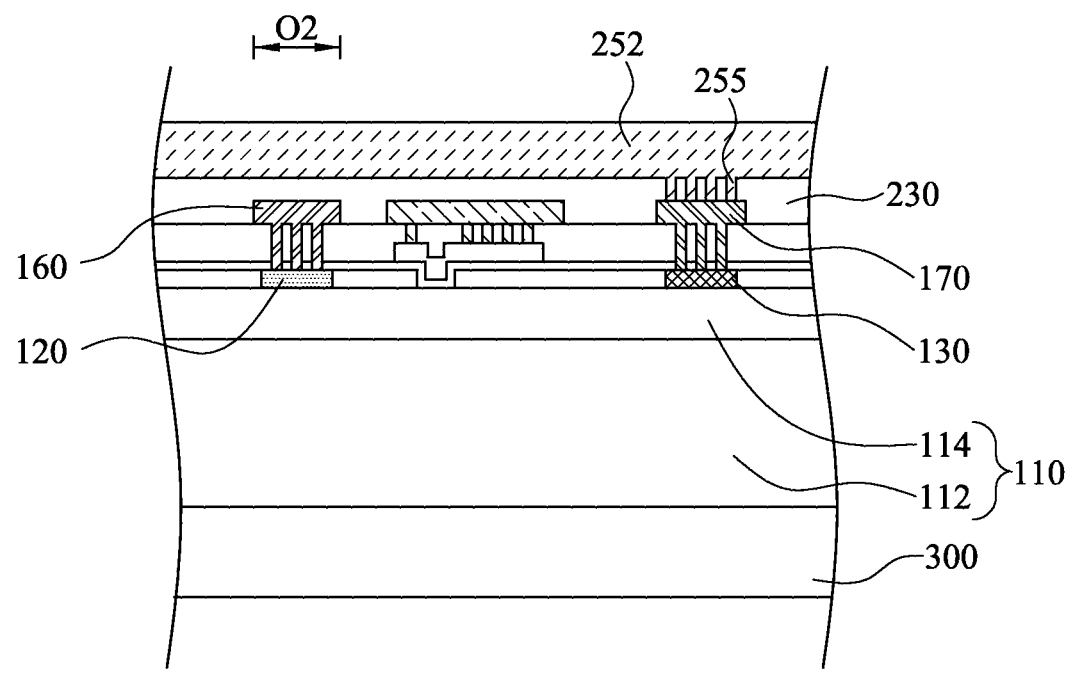
FIG. 7C is a cross-sectional view taken along line 7C-7C of FIG. 6.

FIG. 7C is a cross-sectional view taken along line 7C-7C of FIG. 6. The drain plugs 255 may also be disposed between the drain pad body 252 and the inter-drain layer 170 to provide an adequate electrical connection between the drain pad body 252 and the inter-drain layer 170. In addition, because the drain pad body 252 is electrically isolated from the inter-source layer 160, no plug exists between the drain pad body 252 and the inter-source layer 160 (that is, the portion of the first insulating layer 230 above the overlapping region O2).

Referring again to FIG. 6, in summary, the first source pad 240 is electrically connected to the inter-source layer 160 through the source pad branches 244 and a portion of the source pad body 242. With such a configuration, a sufficient amount of current can flow between the first source pad 240 and the inter-source layer 160 to improve the resistance values of the inter-source layer 160 and the source electrodes 120 (see FIG. 7A). Similarly, the first drain pad 250 is electrically connected to the inter-drain layer 170 through the drain pad branches 254 and a portion of the drain pad body 252. With such a configuration, a sufficient amount of current can flow between the first drain pad 250 and the inter-drain layer 170 to improve the resistance values of the inter-drain layer 170 and the drain electrodes 130 (see FIG. 7A).

Reference is made again to FIGS. 6 and 7A. In the present embodiment, the active area 102 includes the source region SA, the drain region DA, and the region between the source region SA and the drain region DA in which current passes through the active layer 110. In FIG. 6, the first source pad 240 and the first drain pad 250 are completely within the active area 102. In other words, the semiconductor device 100 can be cut along the insulation area 190 according to the present embodiment. Hence, the vast majority of the active area 102 is put to good use and it is not necessary to add extra regions to the non-active area for accommodating source pads and drain pads. As a result, the size of the semiconductor device 100 is effectively reduced, or a semiconductor device is fabricated that is able to sustain a higher breakdown voltage or a larger on current with the same device size.

In other embodiments, however, at least a portion of the source pad region SPA formed by the first source pad 240 on the active layer 110 is outside the active area 102, and/or at least a portion of the drain pad region DPA formed by the first drain pad 250 on the active layer 110 is outside the active area 102. Basically, any design in which the source pad region SPA and the drain region DA form the overlapping region O1 and the area of the overlapping region O1 is smaller than or equal to 40% of the area of the drain region DA, and/or in which the drain pad region DPA and the source region SA form the overlapping region O2 and the area of the overlapping region O2 is smaller than or equal to 40% of the area of the source region SA is within the scope of the invention.

Reference is made again to FIG. 6. In the present embodiment, the number of the inter-source layers 160 and the number of the inter-drain layers 170 are both plural. In order to provide an adequate electrical connection to the inter-source layers 160 and the inter-drain layers 170, the number of the source pad branches 244 may be plural, and the number of the drain pad branches 254 may also be plural. The source pad branches 244 and the drain pad branches 254 are alternately arranged between the source pad body 242 and the drain pad body 252. All the source pad branches 244 are over the inter-source layer 160, and all the drain pad branches 254 are over the inter-drain layer 170. Hence, each of the first source pad 240 and the first drain pad 250 is a finger-shaped element.

In the following, the electrical characteristics of the present embodiment semiconductor device 100 are illustrated with reference to FIG. 6 and FIG. 7A. For the sake of convenience, it is worth noting that a single inter-gate layer 180, a single inter-source layer 160, and a single inter-drain layer 170 are utilized for the calculation of the electrical characteristics in the present embodiment. According to the present example, the inter-source layer 160 has a width W1=4 μm and a length L2=1000 μm, and so the area of the source region SA is L2*W1=4000 μm². The inter-drain layer 170 has a width W2=4 μm and a length L2=1000 μm, and so the area of the drain region DA is L2*W2=4000 μm². In addition, the overlapping region O1 has a length L1=100 μm and the overlapping region O2 has a length L3=100 μm. Hence, the area of the overlapping region O1 is L1*W1=400 μm² and the area of the overlapping region O2 is L3*W2=400 μm². That is, the area of the overlapping region O1 is equal to 10% of the area of the drain region DA, and the area of the overlapping region O2 is equal to 10% of the area of the source region SA. When compared with the traditional vertical circuit layout structure, the amount of parasitic capacitance generated in the present invention structure is 20% of that generated in the traditional vertical circuit layout structure.

The source electrode 120 and the drain electrode 130 both have a thickness T2=0.2 μm, the inter-source layer 160 and the inter-drain layer 170 both have a thickness T1=1 μm, and the first source pad 240 and the first drain pad 250 both have a thickness T3=4 μm. A distance between the source pad body 242 and the drain pad branch 254 is D1=10 μm. A distance between the drain pad body 252 and the source pad branch 244 is D2=10 μm. The source pad branch 244 has a width Ws=15 μm and the drain pad branch 254 has a width Wd=4.2 μm. In addition, the resistivities of the source electrode 120, the drain electrode 130, the inter-source layer 160, the inter-drain layer 170, the first source pad 240, and the first drain pad 250 are all ρ. Since the resistance values of the source electrode 120 and the drain electrode 130 per unit length are much greater than the resistance values of the inter-source layer 160, the inter-drain layer 170, the first source pad 240, and the first drain pad 250 per unit length, effects contributed by the source electrode 120 and the drain electrode 130 can be negligible when calculating the total effects in areas where the inter-source layer 160, the inter-drain layer 170, the first source pad 240, and the first drain pad 250 are located to thereby simplify the calculation. Based on the above, the total resistance of the inter-source layer 160 and the first source pad 240 is approximately calculated as follows:

$$Rs=\rho^*(L3+D2)/(T1^*W1)+\rho^*(L2-L3-D2-L1)/(T1^*W1+T3^*Ws)\sim 40^*\rho$$

(here the resistance of the source pad body 242 is negligible). The total resistance of the inter-drain layer 170 and the first drain pad 250 is approximately calculated as follows:

$$Rd=\rho^*(L1+D1)/(T1^*W2)+\rho^*(L2-L1-D1-L3)/(T1^*W2+T3^*Wd)\sim 65^*\rho$$

(here the resistance of the drain pad body 252 is negligible). If the materials of the source electrode 120, the drain electrode 130, the inter-source layer 160, the inter-drain layer 170, the first source pad 240, and the first drain pad 250 are not changed, the total resistance Rs or Rd of the source pads or the drain pads in the traditional vertical circuit layout structure is approximately 625ρ. It is apparent that both the resistance and parasitic capacitance generated in the semiconductor device 100 of the present embodiment are smaller than those generated in the prior art vertical circuit layout structure. In addition, an area utilization ratio of the semiconductor device 100 of the present embodiment is higher than that in the prior art horizontal circuit layout structure (areas required by the source pads and the drain pads are all outside the active area).

Figure 8:
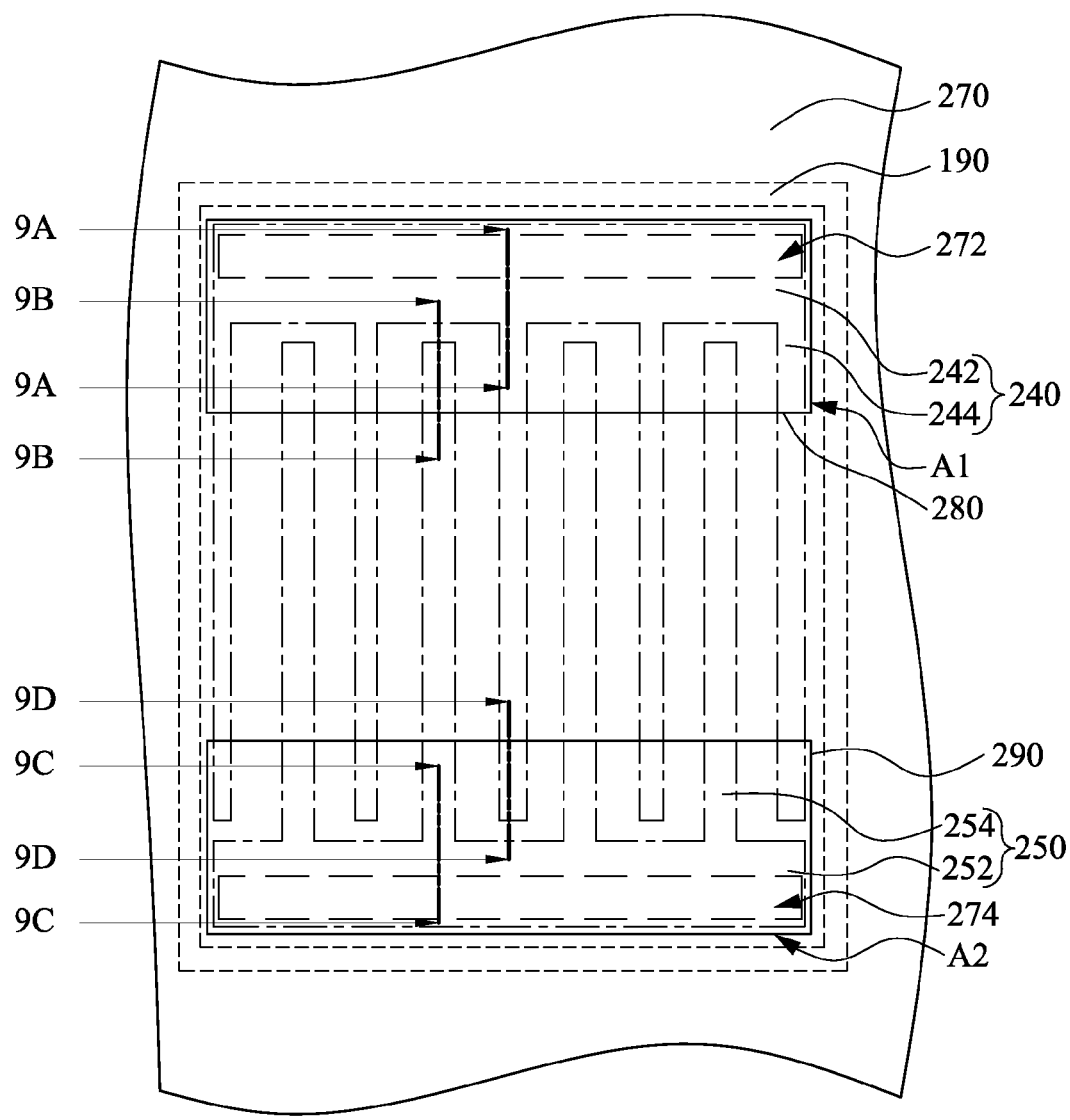
FIG. 8 is a top view of a semiconductor device according to yet another embodiment of the present invention.
Figure 9D:
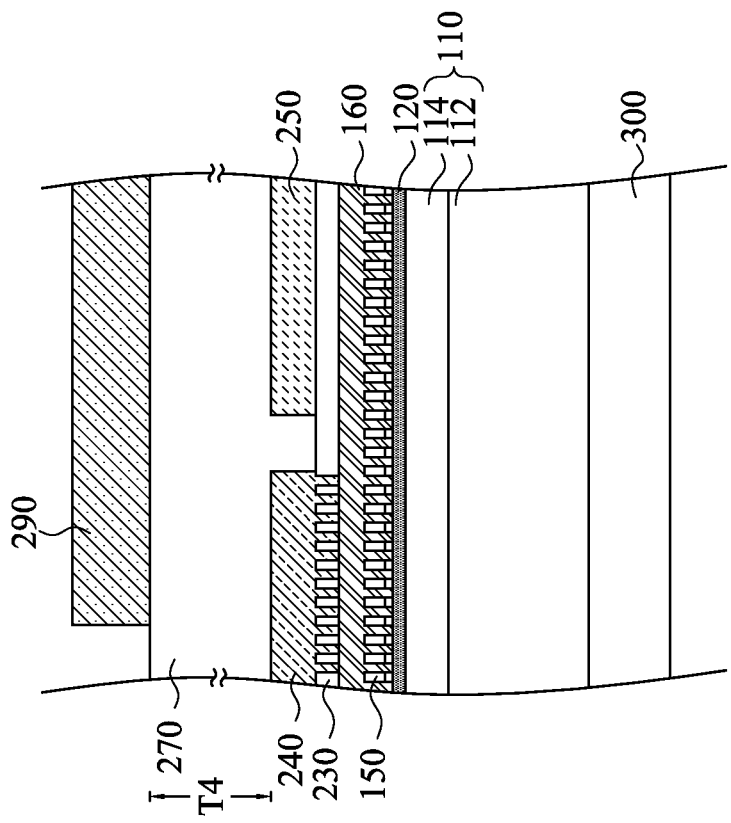
FIG. 9D is a cross-sectional view taken along line 9D-9D of FIG. 8.
Figure 9C:
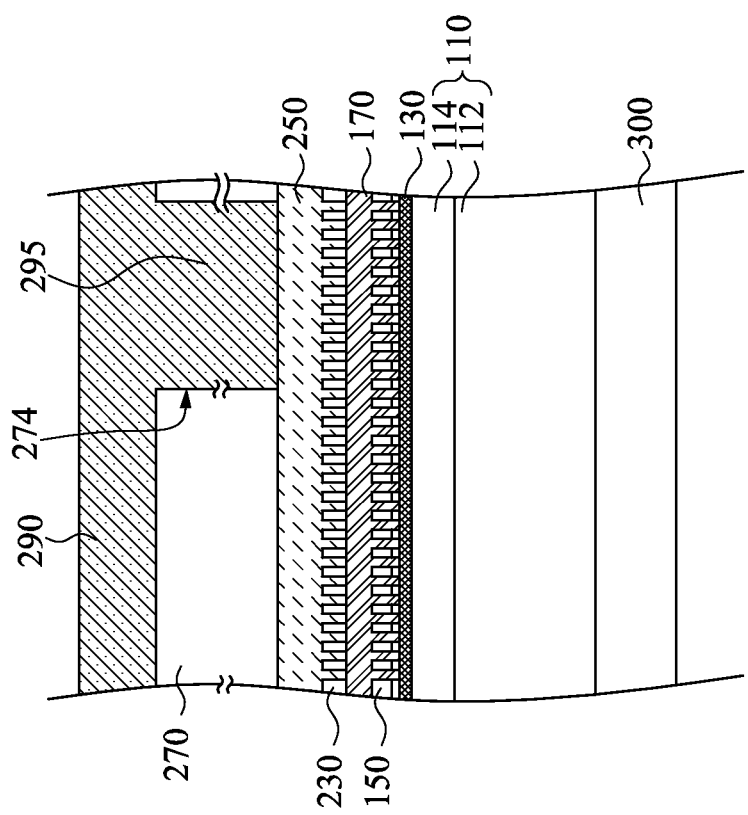
FIG. 9C is a cross-sectional view taken along line 9C-9C of FIG. 8.

FIG. 8 is a top view of a semiconductor device 100 according to yet another embodiment of the present invention. FIG. 9A is a cross-sectional view taken along line 9A-9A of FIG. 8. FIG. 9B is a cross-sectional view taken along line 9B-9B of FIG. 8. FIG. 9C is a cross-sectional view taken along line 9C-9C of FIG. 8. FIG. 9D is a cross-sectional view taken along line 9D-9D of FIG. 8. The difference between the present embodiment and the embodiment of FIG. 6 pertains to the presence of a second insulating layer 270, a second source pad 280, a second drain pad 290, a source pad connection portion 285, and a drain pad connection portion 295. With reference to FIGS. 8, 9A, and 9B, in the present embodiment, the second insulating layer 270 is disposed on the first source pad 240, the first drain pad 250, and the first insulating layer 230. The second insulating layer 270 has a source pad opening 272 to expose a portion of the first source pad 240, and the second insulating layer 270 has a thickness T4 greater than 7 μm. The second source pad 280 is disposed on the second insulating layer 270. The source pad connection portion 285 is disposed in the source pad opening 272 and is electrically connected to the first source pad 240 and the second source pad 280. As shown in FIG. 9A, the second source pad 280 and the first source pad 240 are electrically connected through the source pad connection portion 285. As shown in FIG. 9B, despite the parasitic capacitance generated in the overlapping region formed by the second source pad 280 and the first drain pad 250, the capacitance value of the parasitic capacitance is not large because the thickness T4 of the second insulating layer 270 is greater than 7 μm. Hence, an area of a region A1 formed by an orthogonal projection of the second source pad 280 on the active layer 110 may be greater than an area of the region formed by the orthogonal projection of the source pad body 242 on the active layer 110 to facilitate connection with external circuits.

Reference is made to FIGS. 8, 9C, and 9D. The second insulating layer 270 further has a drain pad opening 274 to expose a portion of the first drain pad 250. The second drain pad 290 is separated from the second source pad 280 and is disposed on the second insulating layer 270. The drain pad connection portion 295 is disposed in the drain pad opening 274 and is electrically connected to the first drain pad 250 and the second drain pad 290. As shown in FIG. 9C, the second drain pad 290 and the first drain pad 250 are electrically connected through the drain pad connection portion 295. As shown in FIG. 9D, despite the parasitic capacitance generated in the overlapping region formed by the second drain pad 290 and the first source pad 240, the capacitance value of the parasitic capacitance is not large because the thickness T4 of the second insulating layer 270 is greater than 7 μm. Hence, an area of a region A2 formed by an orthogonal projection of the second drain pad 290 on the active layer 110 may be greater than an area of the region formed by the orthogonal projection of the drain pad body 252 on the active layer 110 to facilitate connection with external circuits.

In the present embodiment, a material of the second insulating layer 270 includes polyimide (PI), photoresist (PR), benzo cyclo butane (BCB), spin on glass (SOG), plastic, or their combinations. The second insulating layer 270 may be formed on the first source pad 240, the first drain pad 250, and the first insulating layer 230 by, for example, spin coating, but the invention is not limited in this respect. Since other details of the present embodiment are the same as those in the embodiment of FIG. 6, a further description in this regard is not provided.

Figure 10:
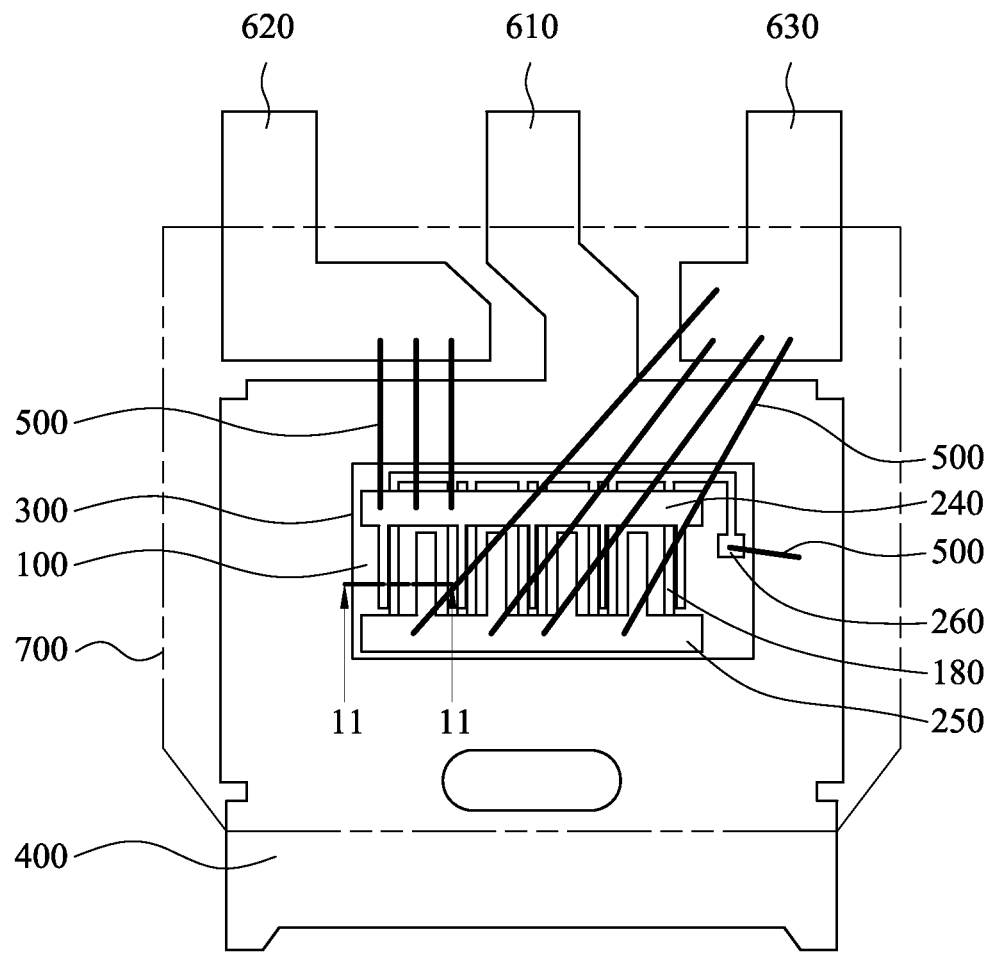
FIG. 10 is a top view of a semiconductor device package according to one embodiment of the present invention.
Figure 11:
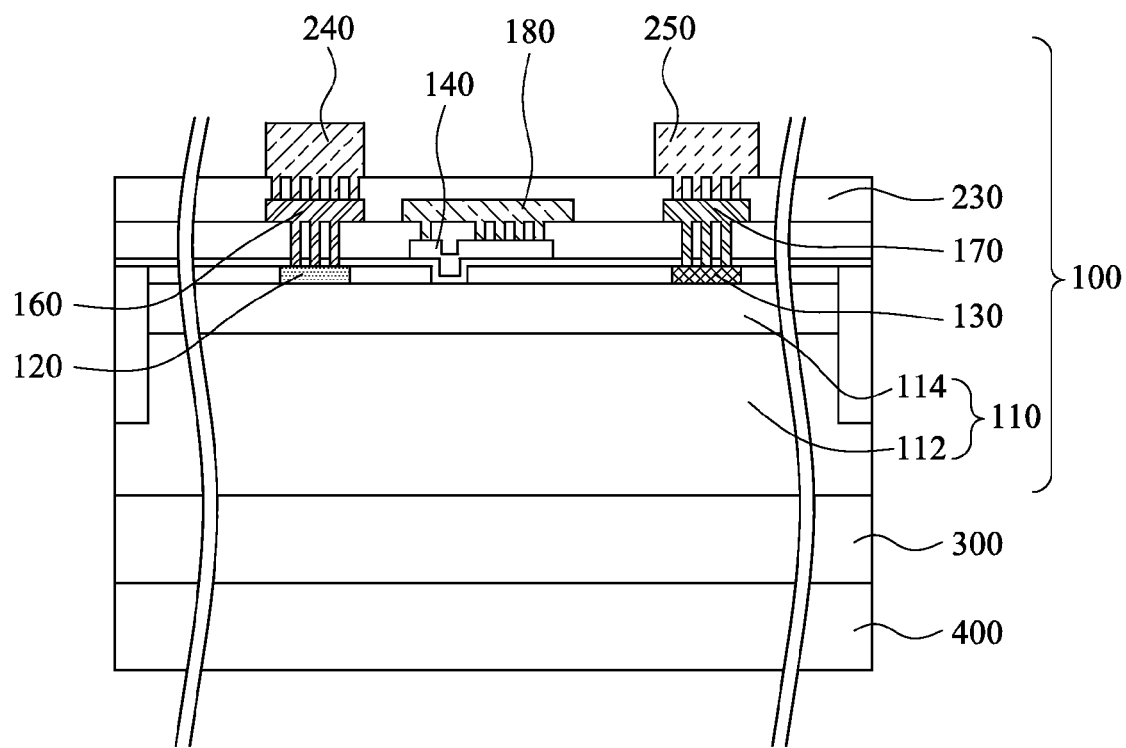
FIG. 11 is a cross-sectional view taken along line 11-11 of FIG. 10.

Another aspect of the present invention is to provide a semiconductor device package. FIG. 10 is a top view of a semiconductor device package according to one embodiment of the present invention, and FIG. 11 is a cross-sectional view taken along line 11-11 of FIG. 10. The semiconductor device package includes the semiconductor device 100, a substrate 300, and a lead frame 400. Although the semiconductor device 100 of FIG. 6 is taken as an example herein, the semiconductor device 100 can be the semiconductor device 100 of any embodiment mentioned above. The semiconductor device 100 is disposed on the substrate 300. The lead frame 400 is disposed on a side of the substrate 300 opposite to the semiconductor device 100 and is electrically connected to the gate electrode 140 of the semiconductor device 100. For example, the lead frame 400 can be electrically connected to the gate pad 260 of the semiconductor device 100 through a conductive element 500, and then electrically connected to the gate electrode 140 through the inter-gate layer 180. The lead frame 400 can be a copper plate, and the claimed scope of the invention is not limited in this respect.

The semiconductor device package of the present embodiment can reduce the parasitic capacitance between the source electrode 120 and the drain electrode 130 of the semiconductor device 100. More specifically, since the lead frame 400 is electrically connected to the gate electrode 140 of the semiconductor device 100, a source-drain parasitic capacitance is not generated between the lead frame 400 and the active layer 110 of the semiconductor layer 100. Accordingly, this package structure can further reduce the parasitic capacitance of the entire semiconductor device package.

The semiconductor device package can further include a gate terminal 610, a source terminal 620, and a drain terminal 630. The gate terminal 610 is electrically connected to the lead frame 400 and the gate electrode 140. In the embodiment of FIG. 10, the gate terminal 610 is connected to the lead frame 400, and the lead frame 400 is electrically connected to the gate electrode 140 through the conductive element 500, the gate pad 260, and the inter-gate layer 180. The source terminal 620 is electrically connected to the source electrode 120. For example, the source terminal 620 can be electrically connected to the source electrode 120 through a conductive element 500, the first source pad 240, and the inter-source layer 160. The drain terminal 630 is electrically connected to the drain electrode 130. For example, the drain terminal 630 can be electrically connected to the drain electrode 130 through a conductive element 500, the first drain pad 250, and the inter-drain layer 170. The source terminal 620 and the drain terminal 630 are both electrically isolated from the lead frame 400. It is noted that the connection method mentioned above is illustrative only. The conductive elements 500 can be respectively electrically connected to the inter-source layer 160, the inter-drain layer 170, and the inter-gate layer 180 when the semiconductor device 100 of FIG. 1 is applied to the semiconductor device package of FIG. 10. Moreover, the conductive elements 500 can be respectively electrically connected to the second source pad 280, the second drain pad 290, and the gate pad (not shown) when the semiconductor device 100 of FIG. 8 is applied to the semiconductor device package of FIG. 10.

Furthermore, the semiconductor device package can further include a package material 700 covering the semiconductor device 100, the substrate 300, the lead frame 400, the conductive elements 500, a portion of the gate terminal 610, a portion of the source terminal 620, and a portion of the drain terminal 630, and exposing another portion of the gate terminal 610, another portion of the source terminal 620, and another portion of the drain terminal 630. For clarity, the package material 700 in FIG. 10 is represented by dashed lines. The package material 700 protects the semiconductor device 100, and the semiconductor device package can be electrically connected to other devices through the exposed portions of the gate terminal 610, the source terminal 620, and the drain terminal 630.

Figure 12:
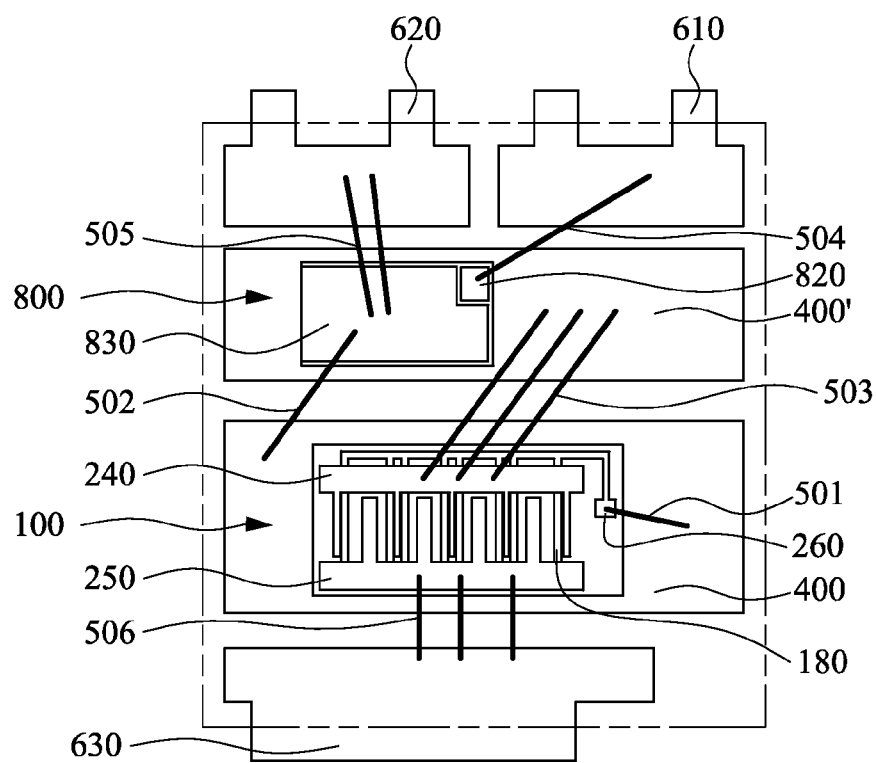
FIG. 12 is a top view of a semiconductor device package according to another embodiment of the present invention.
Figure 13:
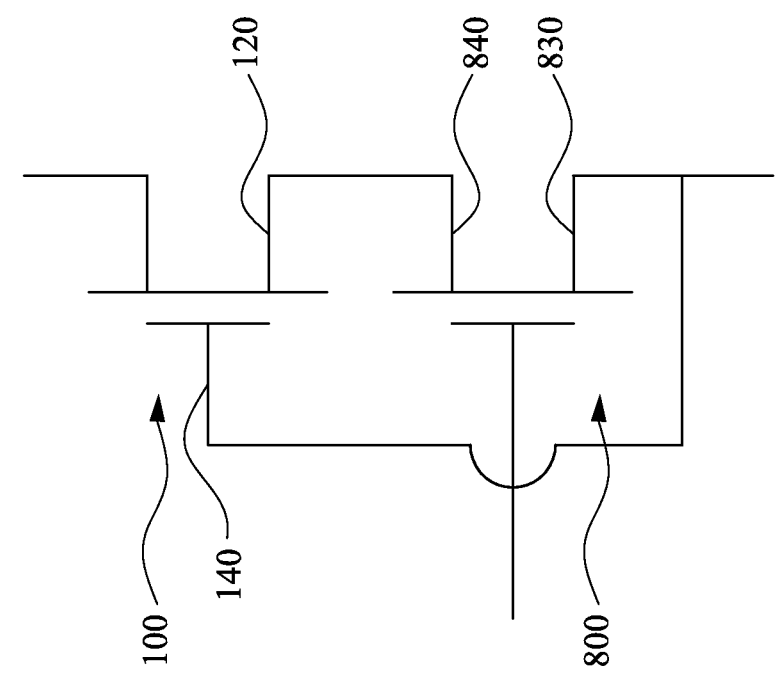
FIG. 13 is a circuit diagram of the semiconductor device package of FIG. 12.

FIG. 12 is a top view of a semiconductor device package according to another embodiment of the present invention, and FIG. 13 is a circuit diagram of the semiconductor device package of FIG. 12. In this embodiment, the semiconductor device 100 is a depletion mode transistor, and the semiconductor device package can further include an enhancement mode transistor 800 electrically connected to the semiconductor device 100. In the circuit diagram of FIG. 13, the source electrode 120 of the semiconductor device 100 is electrically connected to a drain electrode 840 of the enhancement mode transistor 800. Structurally, as shown in FIG. 12, the source electrode 120 (see FIG. 11) of the semiconductor device 100 is electrically connected to the first source pad 240, and the first source pad 240 is electrically connected to another lead frame 400' through a conductive element 503. The drain electrode 840 (see FIG. 13) of the enhancement mode transistor 800 is disposed opposite to a source electrode 830 of the enhancement mode transistor 800. That is, the drain electrode 840 directly touches the lead frame 400' and makes an electrical connection thereto to form the electrical connection between the source electrode 120 of the semiconductor device 100 and the drain electrode 840 of the enhancement mode transistor 800. Furthermore, the gate terminal 610 is electrically connected to a gate electrode 820 of the enhancement mode transistor 800 through a conductive element 504. The source terminal 620 is electrically connected to the source electrode 830 of the enhancement mode transistor 800 through a conductive element 505. The drain terminal 630 is electrically connected to the first drain pad 250 of the semiconductor device 100 through a conductive element 506. In one embodiment of the present invention, the gate electrode 140 of the semiconductor device 100 can be electrically connected to a source electrode 830 of the enhancement mode transistor 800 to simplify the circuit control. As shown in FIG. 12, the gate electrode 140 (see FIG. 11) of the semiconductor device 100 is connected to the gate pad 260, and the gate pad 260 is electrically connected to the lead frame 400 through a conductive element 501. A conductive element 502 is electrically connected to the lead frame 400 and the source electrode 830 of the enhancement mode transistor 800 to form the electrical connection between the gate electrode 140 of the semiconductor device 100 and the source electrode 830 of the enhancement mode transistor 800. In another embodiment of the present invention, depending on product requirements, the semiconductor device package can further include an independent terminal to enable independent circuit control operation with respect to the gate electrode 140 of the semiconductor device 100.

Accordingly, the semiconductor device 100 and the enhancement mode transistor 800 can be combined as an enhancement mode transistor device. Normally, the semiconductor device 100 has a high operating voltage, and the enhancement mode transistor 800 has a high speed switch, such that the semiconductor device 100 and the enhancement mode transistor 800 can be equivalent to an enhancement mode transistor device with a high operating voltage and high speed switch.

Figure 14:
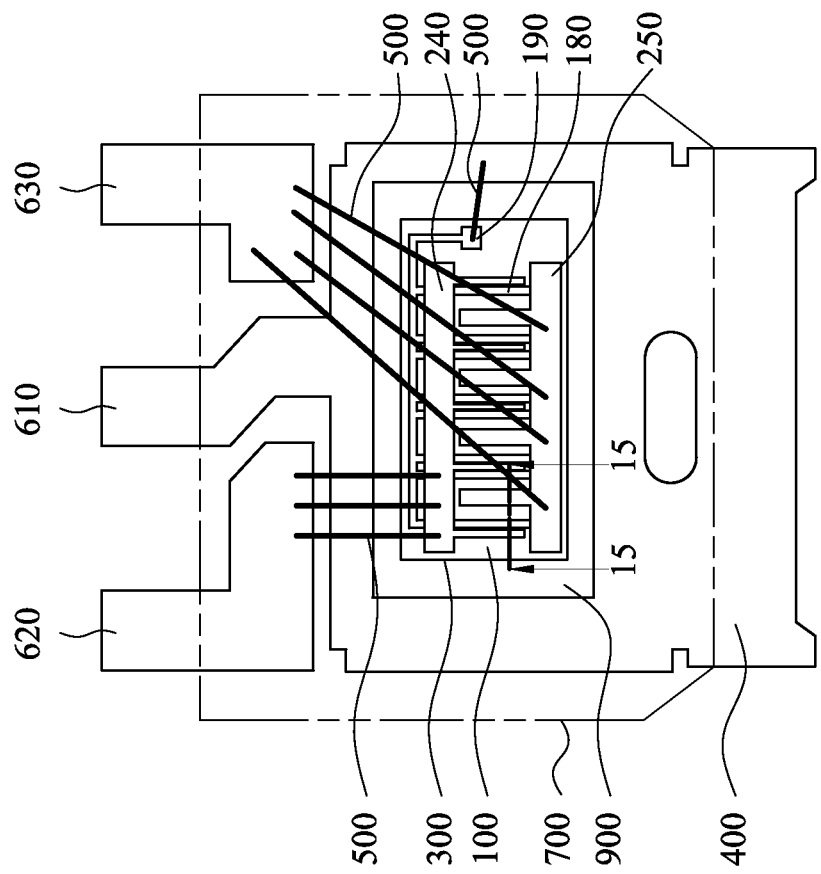
FIG. 14 is a top view of a semiconductor device package according to yet another embodiment of the present invention.
Figure 15:
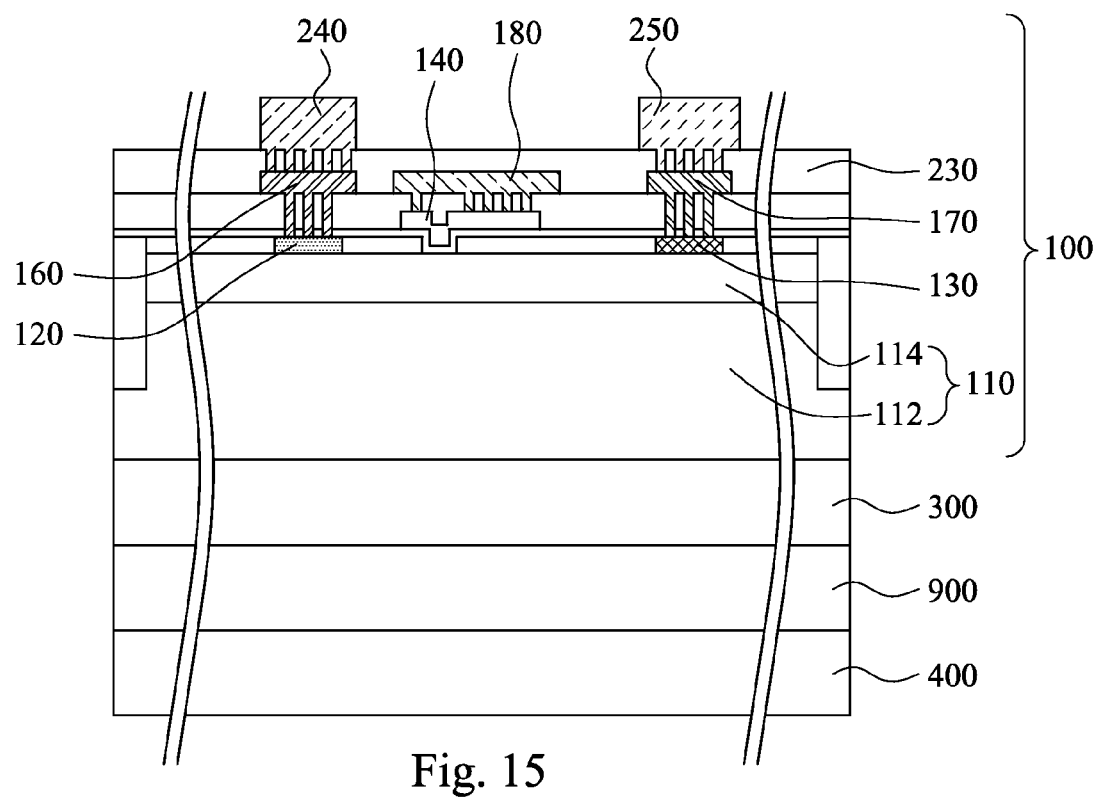
FIG. 15 is a cross-sectional view taken along line 15-15 of FIG. 14.

FIG. 14 is a top view of a semiconductor device package according to yet another embodiment of the present invention, and FIG. 15 is a cross-sectional view taken along line 15-15 of FIG. 14. The difference between the present embodiment and the embodiment of FIG. 10 pertains to the presence of an inter-insulating layer 900. In this embodiment, the semiconductor device package can further include an inter-insulating layer 900 disposed between the lead frame 400 and the substrate 300. The inter-insulating layer 900 can further reduce the overall parasitic capacitance of the semiconductor device package. More specifically, since the lead frame 400 of the semiconductor device package of FIG. 10 is electrically connected to the gate electrode 140, a gate-drain parasitic capacitance is generated between the lead frame 400 and the semiconductor device 100. In this embodiment, although a gate-drain parasitic capacitance (defined as Cgd1) is generated between the substrate 300 and the active layer 110 of the semiconductor device 100, due to the presence of the inter-insulating layer 900, another gate-drain parasitic capacitance (defined as Cgd2) is generated between the substrate 300 and the lead frame 400. The parasitic capacitances Cgd1 and Cgd2 are formed in a series configuration, such that the overall parasitic capacitance of the semiconductor device package can be reduced if the parasitic capacitance Cgd2 is smaller than the parasitic capacitance Cgd1. Other relevant structural details of the present embodiment are all the same as the embodiment of FIG. 10, and, therefore, a description in this regard will not be repeated hereinafter.

Figure 16:
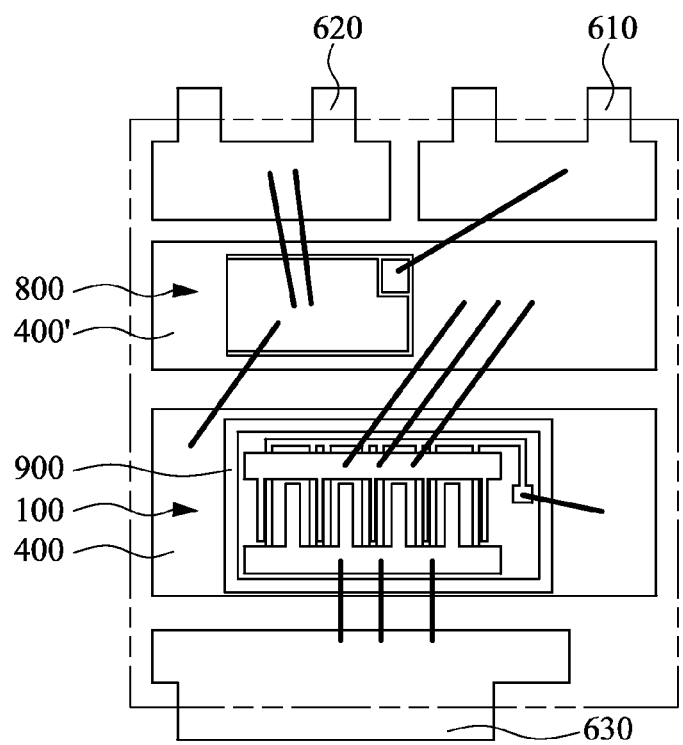
FIG. 16 is a top view of a semiconductor device package according to still yet another embodiment of the present invention.

Reference is made to FIG. 16 which is a top view of a semiconductor device package according to still yet another embodiment of the present invention. The circuit diagram of the semiconductor device package in FIG. 16 is shown in FIG. 13. The difference between the present embodiment and the embodiment of FIG. 12 pertains to the presence of an inter-insulating layer 900. This configuration can further reduce the parasitic capacitance of the semiconductor device package, especially of the semiconductor device 100. Hence, the breakdown voltage of the semiconductor device package is increased. Other relevant structural details of the present embodiment are all the same as the embodiment of FIG. 12, and, therefore, a description in this regard will not be repeated hereinafter.

Figure 17:
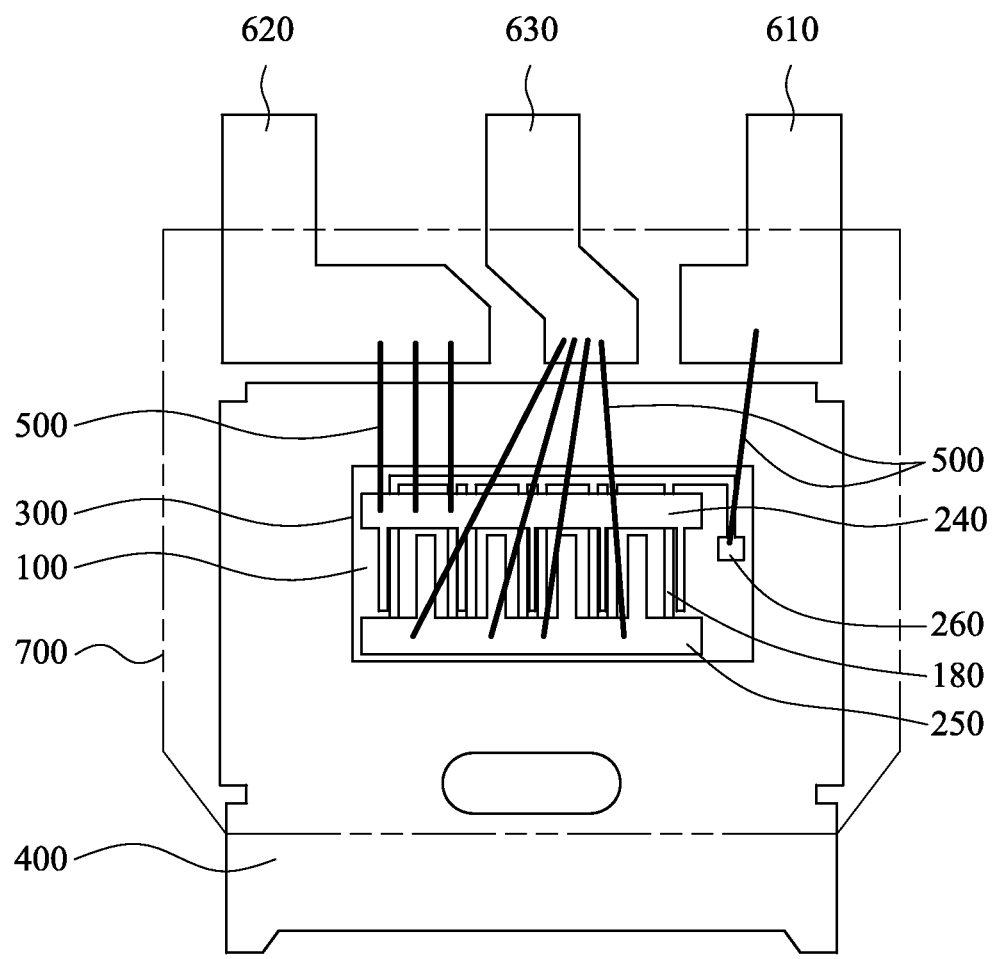
FIG. 17 is a top view of a semiconductor device package according to still yet another embodiment of the present invention.

FIG. 17 is a top view of a semiconductor device package according to still yet another embodiment of the present invention. The cross-sectional view of the semiconductor device 100 of FIG. 17 is shown in FIG. 11. The difference between the present embodiment and the embodiment of FIG. 10 pertains to the electrical connection between the lead frame 400 and the gate electrode 140. In this embodiment, the lead frame 400 is electrically isolated from the gate electrode 140, the source electrode 120, and the drain electrode 130. That is, the lead frame 400 is floating, such that the parasitic capacitance generated between the semiconductor device 100 and the lead frame 400 can be reduced. Structurally, the gate terminal 610 is electrically connected to the gate electrode 140. For example, the gate terminal 610 can be electrically connected to the gate electrode 140 through the conductive element 500, the gate pad 260, and the inter-gate layer 180. The source terminal 620 is electrically connected to the source electrode 120. For example, the source terminal 620 can be electrically connected to the source electrode 120 through the conductive element 500, the first source pad 240, and the inter-source layer 160. The drain terminal 630 is electrically connected to the drain electrode 130. For example, the drain terminal 630 can be electrically connected to the drain electrode 130 through the conductive element 500, the first drain pad 250, and the inter-drain layer 170. All of the gate terminal 610, the source terminal 620, and the drain terminal 630 are electrically isolated from the lead frame 400. Other relevant structural details of the present embodiment are all the same as the embodiment of FIG. 10, and, therefore, a description in this regard will not be repeated hereinafter.

Figure 18:
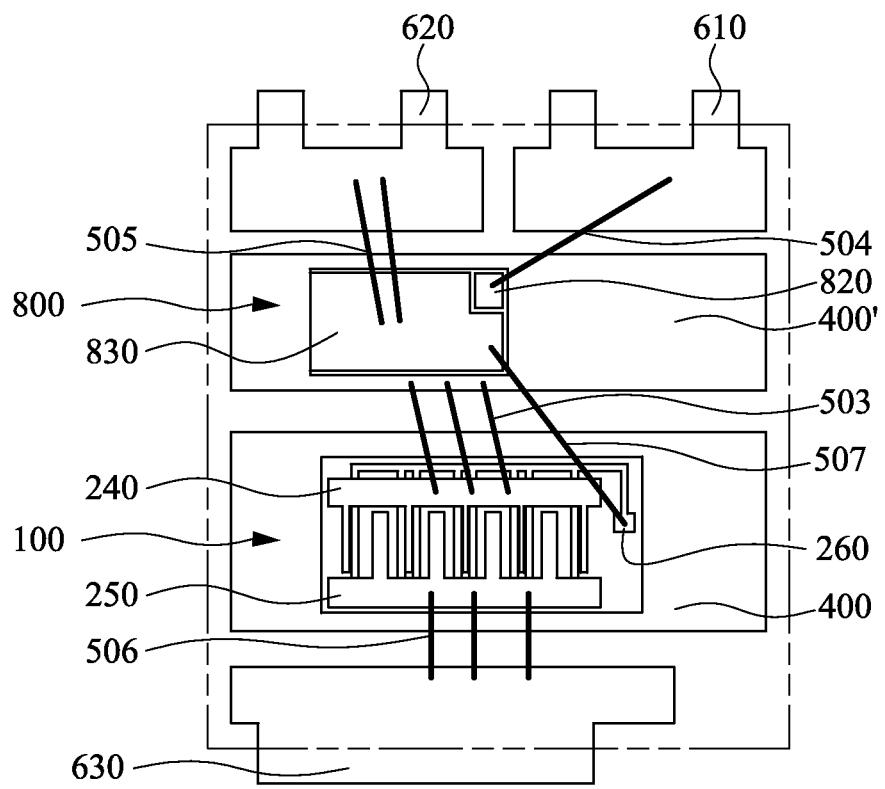
FIG. 18 is a top view of a semiconductor device package according to still yet another embodiment of the present invention.

Reference is made to FIG. 18 which is a top view of a semiconductor device package according to still yet another embodiment of the present invention. The circuit diagram of the semiconductor device package in FIG. 18 is shown in FIG. 13. The difference between the present embodiment and the embodiment of FIG. 12 pertains to the electrical connection between the lead frame 400 and the gate pad 260. In this embodiment, both of the gate pad 260 of the semiconductor device 100 and the source electrode 830 of the enhancement mode transistor 800 are electrically isolated from the lead frame 400. The gate pad 260 is electrically connected to the source electrode 830 directly through a conductive element 507. That is, the lead frame 400 is floating, such that the parasitic capacitance generated between the semiconductor device 100 and the lead frame 400 can be reduced. Other relevant structural details of the present embodiment are all the same as the embodiment of FIG. 12, and, therefore, a description in this regard will not be repeated hereinafter.

Figure 19:
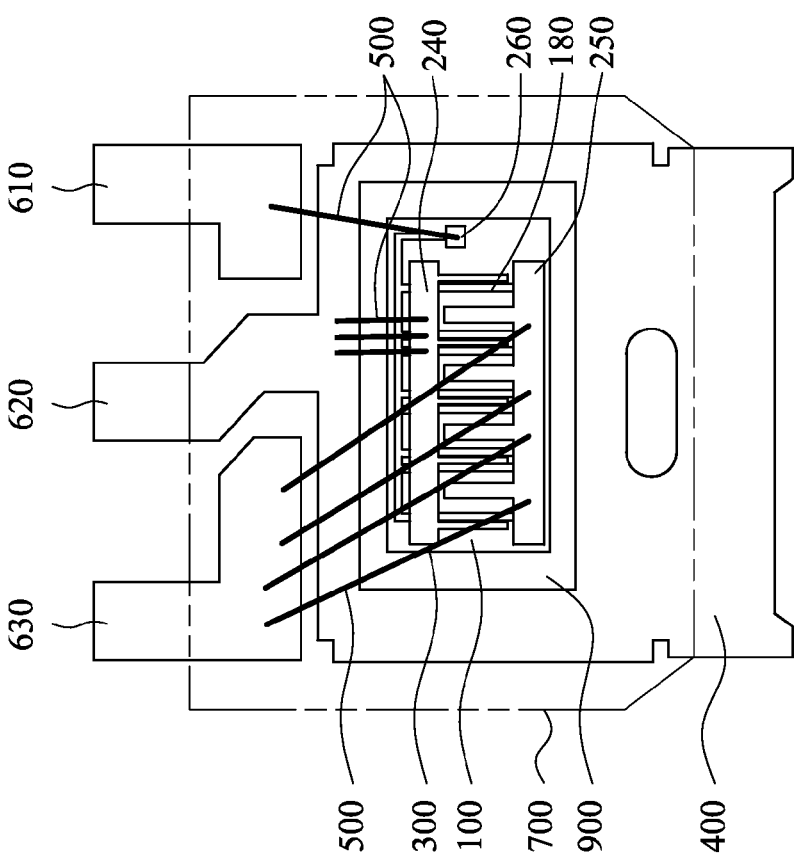
FIG. 19 is a top view of a semiconductor device package according to still yet another embodiment of the present invention.

FIG. 19 is a top view of a semiconductor device package according to still yet another embodiment of the present invention. The cross-sectional view of the semiconductor device 100 of FIG. 19 is shown in FIG. 15. The difference between the present embodiment and the embodiment of FIG. 14 pertains to the electrical connection among the lead frame 400, the gate electrode 140, and the source electrode 120. In this embodiment, the lead frame 400 is electrically connected to the source electrode 120. Alternately, in other embodiments, the lead frame 400 can be electrically connected to the drain electrode 130. Structurally, the gate terminal 610 is electrically connected to the gate electrode 140. For example, the gate terminal 610 can be electrically connected to the gate electrode 140 through the conductive element 500, the gate pad 260, and the inter-gate layer 180. The source terminal 620 is electrically connected to the source electrode 120. For example, the source terminal 620 can be electrically connected to the lead frame 400, and the lead frame 400 is electrically connected to the source electrode 120 through the conductive element 500, the first source pad 240, and the inter-source layer 160. The drain terminal 630 is electrically connected to the drain electrode 130. For example, the drain terminal 630 can be electrically connected to the drain electrode 130 through the conductive element 500, the first drain pad 250, and the inter-drain layer 170.

In this embodiment, a source-drain parasitic capacitance (defined as Cds1) is generated between the substrate 300 and the active layer 110 of the semiconductor device 100. Due to the presence of the inter-insulating layer 900, another source-drain parasitic capacitance (defined as Cds2) is generated between the substrate 300 and the lead frame 400. The parasitic capacitances Cds1 and Cds2 are formed in a series configuration, such that the overall parasitic capacitance of the semiconductor device package can be reduced if the parasitic capacitance Cds2 is smaller than the parasitic capacitance Cds1. Other relevant structural details of the present embodiment are all the same as the embodiment of FIG. 14, and, therefore, a description in this regard will not be repeated hereinafter.

Figure 20:
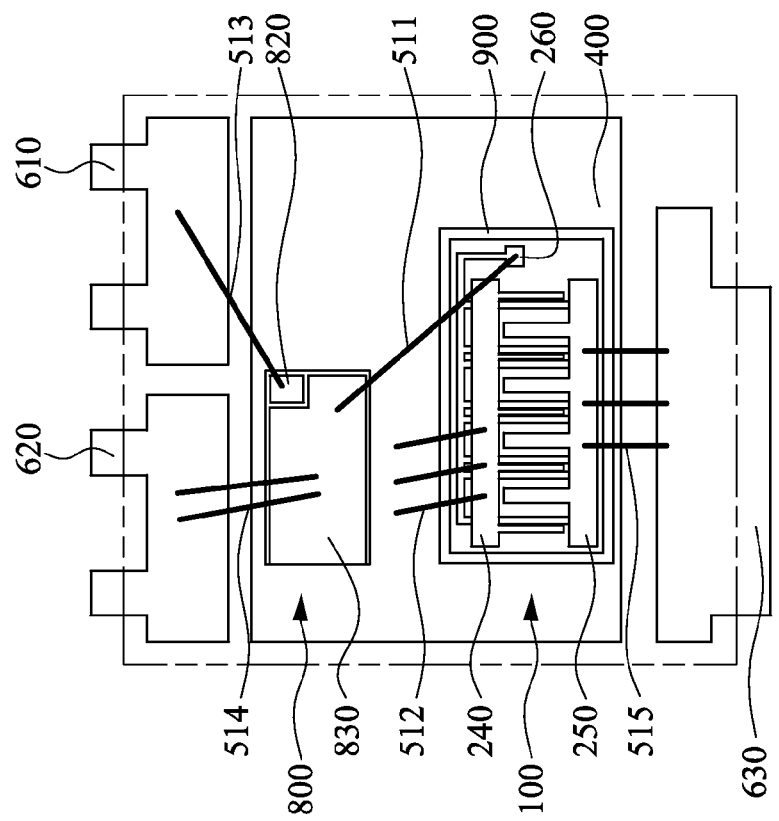
FIG. 20 is a top view of a semiconductor device package according to still yet another embodiment of the present invention.

FIG. 20 is a top view of a semiconductor device package according to still yet another embodiment of the present invention. The circuit diagram of the semiconductor device package in FIG. 20 is shown in FIG. 13, and the cross-sectional view of the semiconductor device 100 in FIG. 20 is shown in FIG. 15. Reference is made to FIGS. 20 and 15. Structurally, as shown in FIG. 20, the gate electrode 140 of the semiconductor device 100 is connected to the gate pad 260 through the inter-gate layer 180, and the gate pad 260 is electrically connected to the source electrode 830 of the enhancement mode transistor 800 through a conductive element 511 to form the electrical connection between the gate electrode 140 of the semiconductor device 100 and the source electrode 830 of the enhancement mode transistor 800. Moreover, the source electrode 120 of the semiconductor device 100 is electrically connected to the first source pad 240 through the inter-source layer 160, and the first source pad 240 is electrically connected to the lead frame 400 through a conductive element 512. The drain electrode 840 (see FIG. 13) of the enhancement mode transistor 800 is disposed opposite to the source electrode 830. That is, the drain electrode 840 directly touches the lead frame 400 and makes an electrical connection thereto to form the electrical connection between the source electrode 120 of the semiconductor device 100 and the drain electrode 840 of the enhancement mode transistor 800. Furthermore, the gate terminal 610 is electrically connected to the gate electrode 820 of the enhancement mode transistor 800 through a conductive element 513. The source terminal 620 is electrically connected to the source electrode 830 of the enhancement mode transistor 800 through a conductive element 514. The drain terminal 630 is electrically connected to the first drain pad 250 of the semiconductor device 100 through a conductive element 515. Other relevant structural details of the present embodiment are all the same as the embodiment of FIG. 16, and, therefore, a description in this regard will not be repeated hereinafter.

Figure 21:
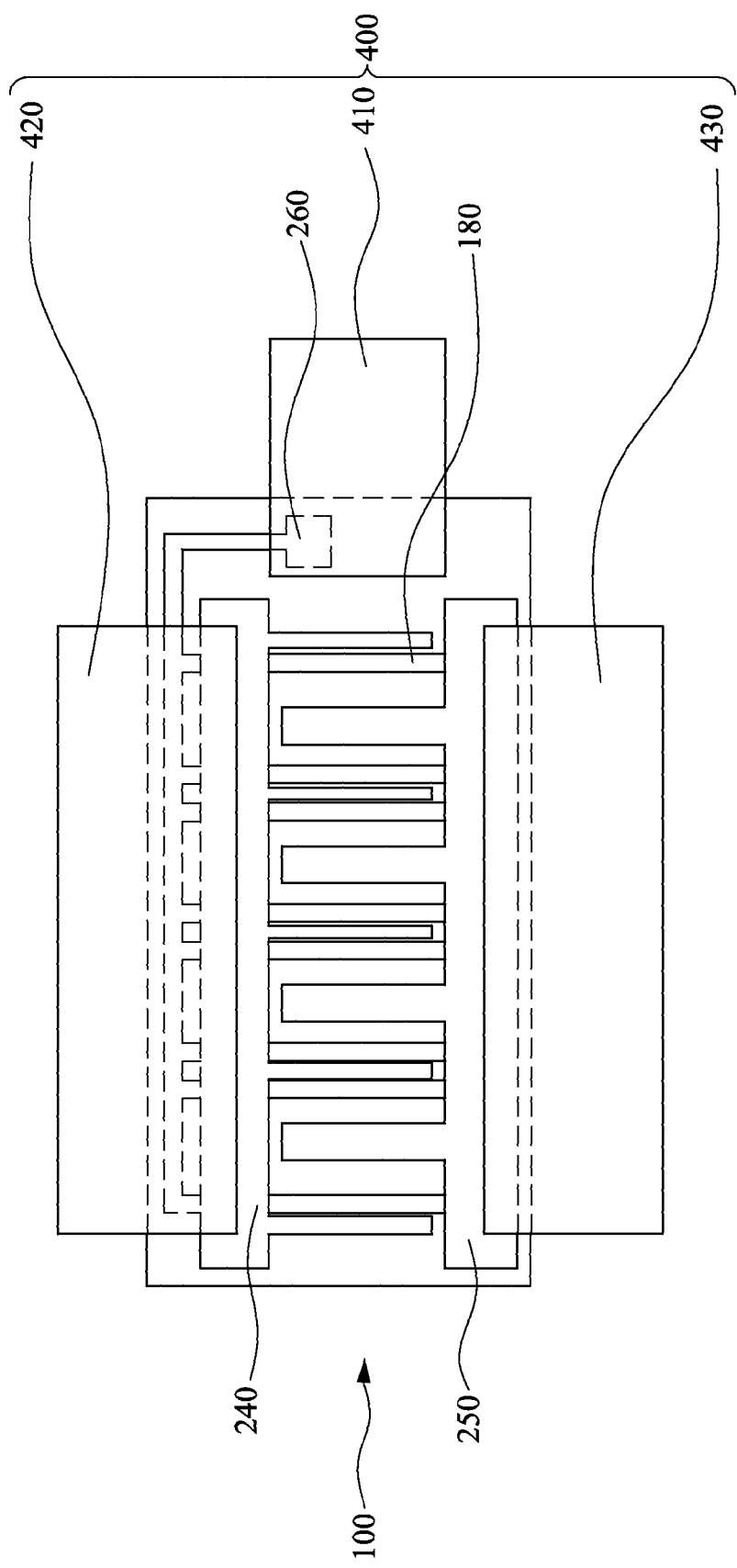
FIG. 21 is a bottom view of a semiconductor device package according to still yet another embodiment of the present invention.

FIG. 21 is a bottom view of a semiconductor device package according to still yet another embodiment of the present invention. The cross-sectional view of the semiconductor device 100 in FIG. 21 is shown in FIG. 11. The difference between the present embodiment and the embodiment of FIG. 10 pertains to the configuration of the lead frame 400. In this embodiment, the semiconductor device package includes a lead frame 400 including a first portion 410, a second portion 420, and a third portion 430, and the semiconductor device 100 is electrically connected to the lead frame 400 using a flip-chip configuration. The first portion 410 is electrically connected to the gate electrode 140. For example, in FIG. 21, the first portion 410 is electrically connected to the gate electrode 140 through the gate pad 260 and the inter-gate layer 180. The second portion 420 is electrically connected to the source electrode 120. For example, in FIG. 21, the second portion 420 is electrically connected to the source electrode 120 through the first source pad 240 and the inter-source layer 160. The third portion 430 is electrically connected to the drain electrode 130. For example, in FIG. 21, the third portion 430 is electrically connected to the drain electrode 130 through the first drain pad 250 and the inter-drain layer 170. The first portion 410, the second portion 420, and the third portion 430 can be terminals to be electrically connected to other elements. In this embodiment, there is no parasitic capacitance between the first portion 410 and the semiconductor device 100, between the second portion 420 and the semiconductor device 100, and between the third portion 430 and the semiconductor device 100 since the first portion 410, the second portion 420, and the third portion 430 respectively touch the gate electrode 140, the source electrode 120, and the drain electrode 130. Other relevant structural details of the present embodiment are all the same as the embodiment of FIG. 10, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A semiconductor device, comprising:
an active layer made of III-V group semiconductors;
at least one source electrode disposed on the active layer;
at least one drain electrode disposed on the active layer;
at least one gate electrode disposed on or above the active layer and between the source electrode and the drain electrode;
an interlayer dielectric covering the source electrode, the drain electrode, and the gate electrode, the interlayer dielectric having at least one first inter-source via hole, at least one first inter-drain via hole, and at least one inter-gate via hole;
at least one inter-source layer disposed on the interlayer dielectric;
at least one inter-source plug filled in the first inter-source via hole and electrically connected to the source electrode and the inter-source layer;
at least one inter-drain layer disposed on the interlayer dielectric;
at least one inter-drain plug filled in the first inter-drain via hole and electrically connected to the drain electrode and the inter-drain layer;
at least one inter-gate layer disposed on the interlayer dielectric and above the gate electrode;
at least one inter-gate plug filled in the inter-gate via hole and electrically connected to the gate electrode and the inter-gate layer;
a first insulating layer covering the inter-source layer, the inter-gate layer, and the inter-drain layer, the first insulating layer having at least one source via hole and at least one drain via hole therein;
a first source pad disposed on the first insulating layer;
a first drain pad disposed on the first insulating layer;
at least one source plug filled in the source via hole and electrically connected to the first source pad and the inter-source layer;
at least one drain plug filled in the drain via hole and electrically connected to the first drain pad and the inter-drain layer;
a second insulating layer disposed on the first source pad, the first drain pad, and the first insulating layer, wherein the second insulating layer has a source pad opening and a drain pad opening to respectively expose a portion of the first source pad and a portion of the first drain pad, and the second insulating layer has a thickness greater than 7 μm;

a second source pad disposed on the second insulating layer;

a second drain pad separated from the second source pad and disposed on the second insulating layer;

a source pad connection portion disposed in the source pad opening and electrically connected to the first source pad and the second source pad; and a drain pad connection portion disposed in the drain pad opening and electrically connected to the first drain pad and the second drain pad.

2. The semiconductor device of claim 1, further comprising:
at least one gate field plate integrally formed with the gate electrode.

3. The semiconductor device of claim 1, further comprising:
at least one gate field plate disposed between the active layer and the interlayer dielectric, and disposed between the gate electrode and the drain electrode, at least a portion of a plurality of the inter-gate plugs being electrically connected to the gate field plate and the inter-gate layer.

4. The semiconductor device of claim 1, wherein orthogonal projections of the inter-source layer and the gate electrode on the active layer are separated from each other.

5. The semiconductor device of claim 1, further comprising:
a passivation layer covering the active layer, the passivation layer having at least one source opening and at least one drain opening therein, the source electrode and the drain electrode being respectively disposed in the source opening and the drain opening to electrically contact the active layer.

6. The semiconductor device of claim 5, further comprising a gate dielectric layer disposed at least between the gate electrode and the active layer.

7. The semiconductor device of claim 6, wherein the passivation layer has a gate opening therein, and the gate electrode conformally covers the gate opening.

8. The semiconductor device of claim 6, wherein the active layer has a recess, the passivation layer has a gate opening therein, the gate opening exposes the recess, and the gate electrode conformally covers the gate opening and the recess.

9. The semiconductor device of claim 1, wherein orthogonal projections of the first source pad and the first drain pad on the active layer are separated from each other.

10. The semiconductor device of claim 1, wherein an orthogonal projection of the inter-source layer on the active layer forms a source region, an orthogonal projection of the first drain pad on the active layer forms a drain pad region, the drain pad region overlaps at least a portion of the source region, and an area of an overlapping region between the drain pad region and the source region is smaller than or equal to 40% of an area of the source region.

11. The semiconductor device of claim 1, wherein an orthogonal projection of the inter-drain layer on the active layer forms a drain region, an orthogonal projection of the first source pad on the active layer forms a source pad region, the source pad region overlaps at least a portion of the drain region, and an area of an overlapping region between the source pad region and the drain region is smaller than or equal to 40% of an area of the drain region.

12. The semiconductor device of claim 1, wherein a resistance value of the first source pad per unit length is smaller than a resistance value of the source electrode per unit length.

13. The semiconductor device of claim 1, wherein a resistance value of the first drain pad per unit length is smaller than a resistance value of the drain electrode per unit length.

14. The semiconductor device of claim 1, wherein the source electrode, the drain electrode, and the gate electrode together define an active area in the active layer, and an orthogonal projection of the first source pad on the active layer forms a source pad region, and at least a portion of the source pad region is within the active area.

15. The semiconductor device of claim 1, wherein the source electrode, the drain electrode, and the gate electrode together define an active area in the active layer, and an orthogonal projection of the first drain pad on the active layer forms a drain pad region, and at least a portion of the drain pad region is within the active area.

16. The semiconductor device of claim 1, wherein an orthogonal projection of the inter-drain layer on the active layer forms a drain region, an orthogonal projection of the inter-source layer on the active layer forms a source region, and the first source pad comprises:
a source pad body, wherein an orthogonal projection of the source pad body on the active layer overlaps at least a portion of the drain region; and
at least one source pad branch;
wherein the first drain pad comprises:
a drain pad body separated from the source pad body, wherein an orthogonal projection of the drain pad body on the active layer overlaps at least a portion of the source region, and the source pad branch extending from the source pad body toward the drain pad body; and
at least one drain pad branch extending from the drain pad body toward the source pad body.

* * * * *